(12) United States Patent
Pike et al.

(10) Patent No.: US 12,249,990 B1
(45) Date of Patent: Mar. 11, 2025

(54) APPARATUS AND METHOD FOR WIDEBAND MULTI-PHASE CLOCK GENERATION

(71) Applicant: CIENA CORPORATION, Hanover, MD (US)

(72) Inventors: Jacob Pike, Ottawa (CA); Naim Ben-Hamida, Ottawa (CA); Jerry Yee-Tung Lam, Markham (CA); Euhan Chong, Kanata (CA); David Berton, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 0 days.

(21) Appl. No.: 18/509,910

(22) Filed: Nov. 15, 2023

(51) Int. Cl.
| | | |
|---|---|---|
| H03K 21/17 | (2006.01) | |
| H03K 3/017 | (2006.01) | |
| H03K 21/40 | (2006.01) | |
| H03L 7/08 | (2006.01) | |

(52) U.S. Cl.
CPC ............. *H03K 3/017* (2013.01); *H03K 21/17* (2013.01); *H03K 21/40* (2013.01); *H03L 7/0807* (2013.01)

(58) Field of Classification Search
CPC ........ H03K 21/17; H03K 21/40; H03K 3/017; H03L 7/08; H03L 7/0807
USPC .......................... 327/115, 117, 175, 291, 295
See application file for complete search history.

(56) References Cited

U.S. PATENT DOCUMENTS

| | | | |
|---|---|---|---|
| 5,914,996 A * | 6/1999 | Huang | H03K 23/50 327/175 |
| 11,233,519 B1 | 1/2022 | Lam et al. | |
| 2002/0009170 A1 | 1/2002 | Schmatz | |
| 2008/0063124 A1 | 3/2008 | Song et al. | |
| 2012/0313683 A1 | 12/2012 | Rylov | |
| 2013/0207707 A1 | 8/2013 | Agrawal et al. | |
| 2014/0103986 A1 | 4/2014 | De Caro et al. | |
| 2014/0269783 A1 | 9/2014 | Bae et al. | |
| 2017/0331619 A1 | 11/2017 | Azenkot et al. | |
| 2018/0106889 A1 | 4/2018 | Schuck et al. | |
| 2019/0028093 A1 | 1/2019 | Tsuji | |
| 2019/0058576 A1 | 2/2019 | Lim | |
| 2019/0334693 A1 | 10/2019 | Liu et al. | |
| 2023/0006680 A1 | 1/2023 | Lam et al. | |
| 2024/0187008 A1 | 6/2024 | Pike et al. | |

OTHER PUBLICATIONS

"Kaiser window", MATLAB kaiser, Printed Nov. 2022, 3 pages.
"Kaiser window", FIR filter design estimation parameters-MATLAB kaiserord, Printed Nov. 2022, 7 pages.
(Continued)

*Primary Examiner* — William Hernandez
(74) *Attorney, Agent, or Firm* — Guntin & Gust, PLC; Robert Gingher

(57) ABSTRACT

Aspects of the subject disclosure may include, for example, an inner clock generation circuit, including: a selectable frequency divider having: a ring of tri-state inverters; a reset gate on an output of each tri-state inverter in the ring; and a reset circuit comprising one or more selectable flip-flops; and a duty-cycle limiter that generates clock signals having a 25% duty cycle from three out of four quadrature clock signals. Other embodiments are disclosed.

20 Claims, 23 Drawing Sheets

(56) References Cited

OTHER PUBLICATIONS

Chen, Wei-Chih, et al., "A 4-to-18GHz Active Poly Phase Filter Quadrature Clock Generator with Phase Error Correction in 5nm CMOS", Downloaded Jun. 13, 2022, 2 pages.

Chen, Stanley, et al., "Clock Generation for High-Speed Links", IEEE International Solid-State Circuits Conference (ISSCC); Session 25, 25.1, 2018, 3 pages.

Dalt, Nicola Da, et al., "On the Jitter Requirements of the Sampling Clock for Analog-to-Digital Converters", IEEE Transactions on Circuits and Systems—I: Fundamental Theory and Applications, vol. 49, No. 9, Sep. 2002, 7 pages.

Gangasani, G., et al., "Ultra-High-Speed Wireline", IEEE International Solid-State Circuits Conference (ISSCC); ISSCC 2022; Session 6, 6.5, 2022, 3 pages.

Goyal, Arun, et al., "A High-Resolution Digital Phase Interpolator based CDR with a Half-Rate Hybrid Phase Detector", Conference Paper, May 2019, 6 pages.

Guo, Z., et al., "6.2 A 112.5Gb/S ADC-DSP-Based PAM-4 Long-Reach Transceiver with >50dB Channel Loss in 5nm FinFET", ISSCC 2022 / Session 6 / Ultra-High-Speed Wireline / 6.2, 2022 IEEE International Solid-State Circuits Conference, 3 pp.

Guo, Z., et al., "Ultra-High-Speed Wireline", IEEE International Solid-State Circuits Conference (ISSCC); Session 6, 6.2, 2022, 3 pages.

Hafez, Amr Amin, et al., "Analysis and Design of Superharmonic Injection-Locked Multipath Ring Oscillators", IEEE Transactions on Circuits and Systems-I: Regular Papers, vol. 60, No. 7, Jul. 2013, 1712-1725.

Im, Jay, et al., "Ultra-High-Speed Wireline", IEEE International Solid-State Circuits Conference (ISSCC), Session 6, 6.1, 2020, 3 pages.

Jee, Dong-Woo, et al., "A FIR-Embedded Phase Interpolator Based Noise Filtering for Wide-Bandwidth Fractional-N PLL", IEEE Journal of Solid-State Circuits, vol. 48, No. 11, Nov. 2013, 10 pages.

Kong, Long, et al., "A 2.4-GHz RF Fractional-N Synthesizer With BW = 0.25 fREF", IEEE Journal of Solid-State Circuits, vol. 53, No. 6, Jun. 2018, 12 pages.

Monaco, Enrico, et al., "A 2-11 GHz 7-Bit High-Linearity Phase Rotator Based on Wideband Injection-Locking Multi-Phase Generation for High-Speed Serial Links in 28-nm CMOS FDSOI", IEEE Journal of Solid-State Circuits, Jul. 2017, 14 pages.

Narayanan, Aravind Tharayil, et al., "A Fractional-N Sub-Sampling PLL using a Pipelined Phase-Interpolator With an FoM of -250 dB", IEEE Journal of Solid-State Circuits, vol. 51, No. 7, Jul. 2016, 11 pages.

Rice, S. O., "Mathematical Analysis of Random Noise", Bell System Technical Journal, Downloaded on Jun. 18, 2023, 52 pages.

Rogers, Jonathan E., "200Gb/s Serial Transceiver Design: Challenges and Opportunities", IEEE International Solid-State Circuits Conference; Forum 4.2, 2022, 41 pages.

Segal, Yoav, et al., "Ultra-High-Speed Wireline", IEEE International Solid-State Circuits Conference (ISSCC); Session 6, 6.1, 2022, 3 pages.

Tyagi, Kshitiz, et al., "Performance Bounds of ADC-Based Receivers Due to Clock Jitter", IEEE Transactions on Circuits and Systems-II: Express Briefs, vol. 70, No. 5, May 2023, 5 pages.

Wang, Zhaowen, et al., "Advanced Wireline Links and Techniques", IEEE International Solid-State Circuits Conference (ISSCC); Session 17, 17.6, 2022, 3 pages.

Ye, Bingyi, et al., "Ultra-High-Speed Wireline", IEEE International Solid-State Circuits Conference (ISSCC); Session 6, 6.3, 2022, 3 pages.

Zand, Bahram, et al., "Ultra-High-Speed Wireline", IEEE International Solid-State Circuits Conference (ISSCC), 2022, 3 pages.

Zhao, Yu, et al., "Advanced Wireline Links and Techniques", IEEE International Solid-State Circuits Conference (ISSCC); Session 17, 17.4, 2022, 3 pages.

"International Search Report and Written Opinion for Application No. PCT/US2023/081519", Jun. 5, 2024, 14 pages.

Yu, Zhengtao, et al., "A 610-M Hz FIR Filter Using Rotary Clock Technique", IEEE 2007 Custom Intergrated Circuits Conference (CICC), 2007, 4 pages.

\* cited by examiner

200

210

220

412

411

500

610

630

710

720

APPARATUS AND METHOD FOR WIDEBAND MULTI-PHASE CLOCK GENERATION

CROSS REFERENCE TO RELATED APPLICATIONS

The subject disclosure is related to U.S. patent application Ser. No. 18/060,787 entitled, "Method and Apparatus for Clock and Data Alignment that Reduces Power Consumption," filed on Dec. 1, 2022, and U.S. patent application Ser. No. 18/509,565 entitled, "Multiphase Clock Generator," filed on even date herewith, each of which is incorporated by reference herein.

FIELD OF THE DISCLOSURE

The subject disclosure relates to an apparatus and method for wideband multi-phase clock generation.

BACKGROUND

Data center demand for greater bandwidth continues to increase thereby requiring faster optical and electrical communication hardware. However, capacity and environmental concerns place a limit on the amount of power that such communication hardware may consume. Existing data centers are equipped to handle a limited amount of power from the grid. Current estimates suggest that data centers will consume 8% of the world's total power by 2030.

To limit the total power consumed in data centers, key hardware-namely Analog-to-Digital Converters (ADCs), Digital-to-Analog Converters (DACs) and Serializer-Deserializers (SerDes)—must increase their power in proportion with their speed. For example, a 224 Gigabit Per Second (Gb/s) Very Short Reach (VSR) SerDes is expected to consume 448 mW total, which corresponds to a power efficiency of 2 Picojoules Per Bit (pJ/b).

In addition to the power consumption, jitter and skew generated by a clocking path directly impacts the Signal-to-Noise and Distortion Ratio (SNDR) of the transmitted or received data. Jitter is a measure of how much a clock's edges vary between cycles. Skew is a fixed measure of how much a clock edge deviates from its ideal location. SNDR is impacted by both jitter and skew because they cause the sampling point to deviate from an ideal point in the data. The SNDR contribution due to jitter can be mathematically predicted based on the Nyquist frequency of the input data. Similarly, skew causes harmonics to appear in the output data spectrum, which further degrades the SNDR. Hence, these plural quantitative metrics: power, area, jitter, skew and SNDR, and other qualitative metrics (complexity, reliability, scalability) should be considered when designing and implementing multiphase clock generators.

BRIEF DESCRIPTION OF THE DRAWINGS

Reference will now be made to the accompanying drawings, which are not necessarily drawn to scale, and wherein.

DETAILED DESCRIPTION

The subject disclosure describes, among other things, illustrative embodiments for an inner clock generation circuit. Other embodiments are described in the subject disclosure.

One or more aspects of the subject disclosure include an inner clock generation circuit, including: a selectable frequency divider having: a ring of tri-state inverters; a reset gate on an output of each tri-state inverter in the ring; and a reset circuit comprising one or more selectable flip-flops; and a duty-cycle limiter that generates clock signals having a duty cycle less than 100% from three out of four quadrature clock signals.

One or more aspects of the subject disclosure include a method for creating a deterministic starting state of a ring-based injection locked frequency divider in an inner clock generation circuit, the method including: implementing a reset gate on an output of each tri-state inverter in a ring of tri-state inverters; implementing a reset circuit comprising one or more selectable flip-flops; applying a reset signal to each reset gate, wherein the reset gate forces the output of the tri-state inverter to a starting state; and applying a phase select signal to the reset circuit, wherein the reset circuit inverts the output of the tri-state inverter.

One or more aspects of the subject disclosure include an inner clock generation circuit, having: a central phase-locked loop; a clock and data recovery component coupled to the central phase-locked loop configured to generate two phases of clock signals; a selectable frequency divider coupled to the clock and data recovery component configured to generate quadrature clock signals, including: a ring of tri-state inverters; a reset gate on an output of each tri-state inverter in the ring; and a reset circuit comprising one or more selectable flip-flops; a multiphase clock generator coupled to the selectable frequency divider; a deskew stage coupled to the multiphase clock generator, wherein the multiphase clock generator and the deskew stage are configured to generate sixteen phases of clock signals; a duty-cycle limiter coupled to the deskew stage and a rank 1 track and hold sampling circuit, wherein the duty-cycle limiter generates clock signals having a 25% duty cycle from three out of four quadrature clock signals out of the sixteen phases of clock signals; and a rank 2 phase rotator coupled to the deskew stage and a rank 2 track and hold sampling circuit.

To limit the total power consumed in data centers, key hardware, namely ADCs, DACs and SerDes, must only increase their power at the same rate as their speed. For example, 224 Gigabit Per Second (Gb/s) Very Short Reach (VSR) SerDes are expected to consume 448-mW total which corresponds to a power efficiency of 2 Picojoules Per Bit (pJ/b).

Figure 1A:
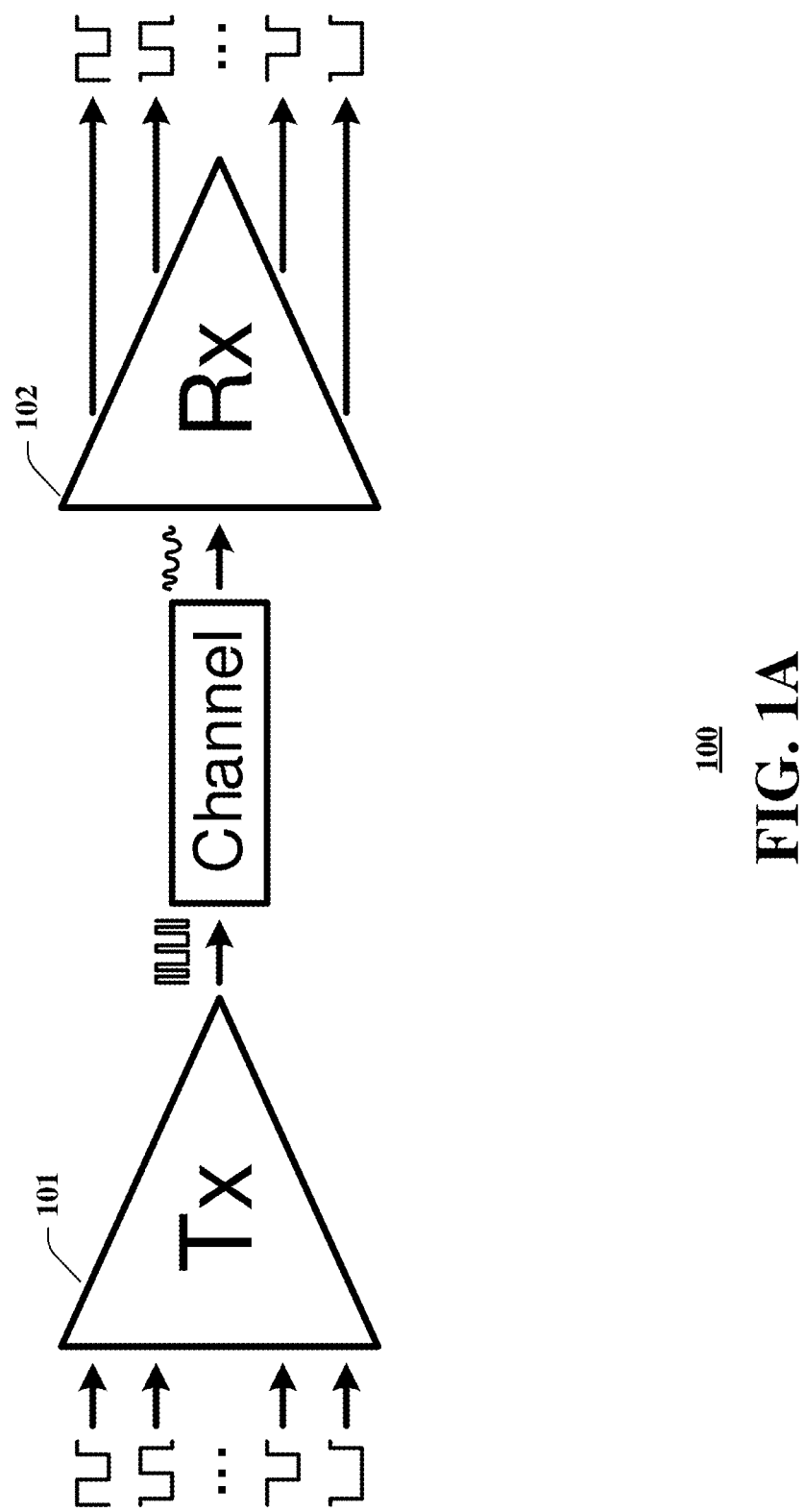
FIG. 1A is a block diagram illustrating an exemplary, non-limiting embodiment of a serializer-deserializer in accordance with various aspects described herein.

FIG. 1A is a block diagram illustrating an exemplary, non-limiting embodiment of a serializer-deserializer in accordance with various aspects described herein. As shown in FIG. 1A, SerDes 100 comprises two main blocks: a Transmitter (Tx 101) and a Receiver (Rx 102). Tx 101 serializes many low-speed data paths into one high-speed data path. Conversely, Rx 102 deserializes the high-speed data path into many low-speed data paths. As transmission speeds increase, SerDes 101 becomes increasingly reliant on high-speed medium-resolution DACs and ADCs to perform their serialization and deserialization.

The basic purpose of an ADC is to receive a single analog signal and convert it to an N-bit binary bus. Modern ADCs use time-interleaved structures where a Sampling Front-End (SFE) first deserializes the data into lower-speed paths before parallel sub-ADCs, each operating at $$\frac{F_s}{\text{Rank1} \times \text{Rank2}},$$

perform the actual data conversion. Fs is the overall sampling rate of the ADC. Rank 1 and Rank 2 are integers that represent the number of low-speed data paths after the first and second stages of interleaving respectively.

Modern ADCs have sampling rates in the range of 100- to-200 Gigasamples Per Second (GS/s) and could require multi-phase clocks operating anywhere from $$\frac{F_s}{\text{Rank1} \times \text{Rank2}} \text{ to } \frac{F_s}{2}.$$

As an example, a 112-GS/s ADC is required to perform PAM4 encoded data transmission at 224-Gb/s. A common approach for the ADC is Rank 1=8 and Rank 2=12, requiring eight-phase clocks at $$\frac{F_s}{8} = 14 \text{ GHz}$$

and 96-phase clocks at $$\frac{F_s}{8 \times 12} = 1.167 \text{ GHz}.$$

Figure 1B:
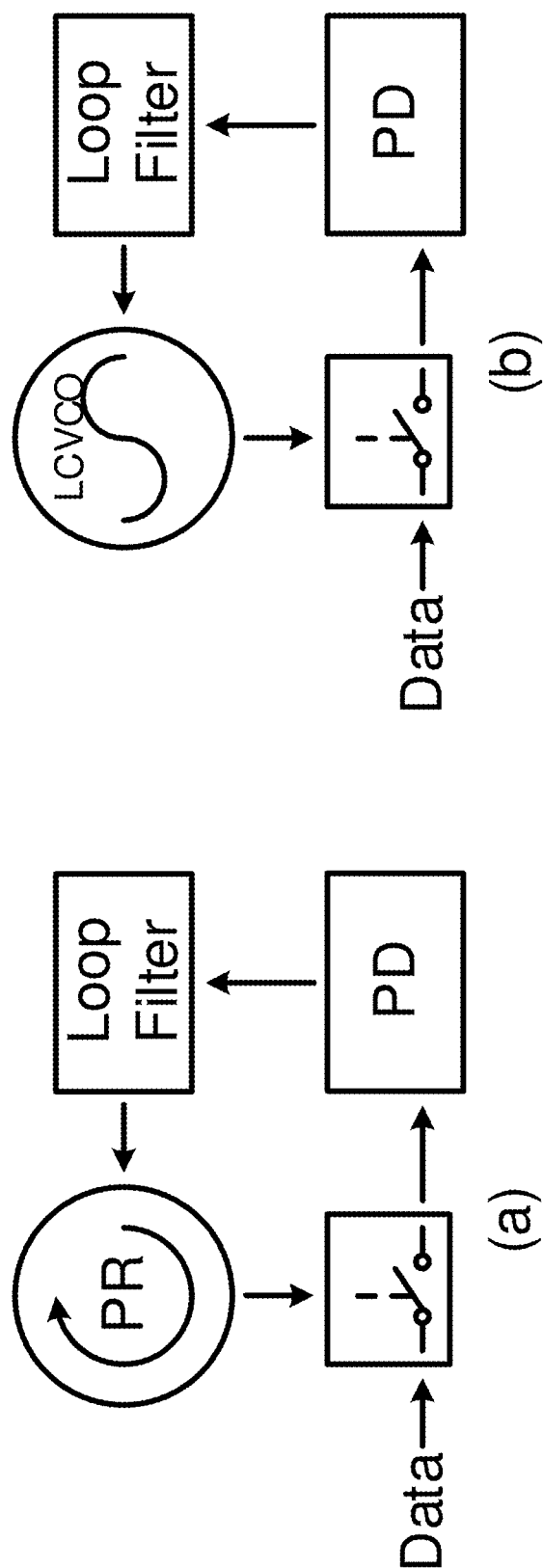
FIG. 1B is a block diagram illustrating an exemplary, non-limiting embodiment of a clock and data recovery loop in accordance with various aspects described herein.

FIG. 1B is a block diagram illustrating an exemplary, non-limiting embodiment of a clock and data recovery loop in accordance with various aspects described herein. Another important aspect of SerDes is the clock-to-data alignment to ensure sampling is occurring at the optimal point. As shown in FIG. 1B, a clock and data recovery (CDR) loop 110 performs this alignment. The basic operation of a CDR recovers data and compares it to its sampling clock using a Phase Detector (PD). The PD outputs pulses equivalent to the phase mismatch between the data and sampling clock. These pulses are then filtered and used to drive either (a) a phase rotator (PR) or (b) an LC voltage-controlled oscillator (LCVCO).

Of these two strategies, LCVCO-based CDRs are less common because of their high power and area consumption. However, CDRs have begun using LCVCOs to meet the stringent jitter requirements. For example, 200-Gb/s SerDes implementations are expected to target <75fs, rms random jitter. This shift is largely due to the difficulty in designing a PR that can meet this jitter requirement. However, the subject disclosure presents new concepts that make the implementation of PR-based CDRs possible at 200-Gb/s and beyond.

Clock generation is one of the biggest consumers of power and area in a wireline transceiver. Clocking is also a key factor in system performance since the jitter and skew generated by the clocking path directly impacts the Signal-to-Noise and Distortion Ratio (SNDR) of the transmitted/received data.

Another quantitative metric used to evaluate clocking architectures is the bandwidth of the entire inner clock generation. For electrical transceivers it is important to support state-of-the-art and legacy standards defined by OIF-CEI (56-Gb/s, 112-Gb/s and 224-Gb/s) and IEEE 802.3 ethernet standards (53-Gb/s, 106-Gb/s, 212-Gb/s). These standards necessitate sampling rates in the range of 26.5-GS/s to 112-GS/s. For optical transceivers it is important to support many different standards (FlexO-8-DPO, 800ZR, 800LR etc.), modulation formats (PCS-QAM, 16-QAM etc.) and oversampling ratios that may be used in the ADC/DAC (T-space, 9/8, 5/4 etc.). These applications and oversampling ratios necessitate baud rates in the range of 118-GS/s to 160-GS/s.

To support anywhere from 56 to 112 to 224 Gb/s to even twice as fast as that on the optical side with traditional methods of inner clock generation that rely on inductive peaking, tuned elements, and/or injection locked ring oscillators or delay locked loops, each of which having limited bandwidth, a entirely different topology would be needed from one data rate to another, or at the very least, inductors would need to be tuned. One circuit using such components would not support all of the data rates specified by the state-of-the-art and legacy standards.

To cover these standard data rates with a single clocking architecture, a wide bandwidth design is required. First rank interleaving is commonly performed at Fs/8 or Fs/16 in a receiver, which requires clocks ranging from 3.3125-GHz to 20-GHz at Fs/8 or 1.65625-GHz to 10-GHz at Fs/16. For some components of the clocking architecture this coverage range can be reduced with frequency dividers but the final stages of the design—those just before the data path-will need to cover the full range. Even with dividers the early stages cannot be narrowly tuned. For example, Fs/8 and Fs/16 can range from 13.25-GHz to 20-GHz and 6.625-GHz to 10-GHz to cover 106-GS/s to 160-GS/s. Since the clocking circuits cannot be narrowly tuned, both power and jitter standards are also more difficult to meet since inductive peaking cannot be used to boost amplitude and provide filtering.

Figure 2A:
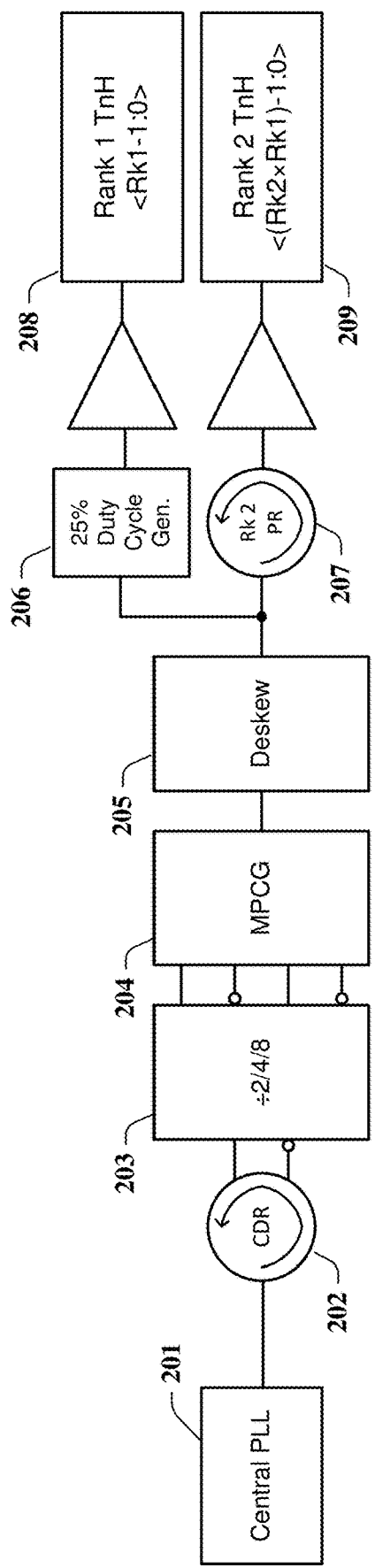
FIG. 2A is a block diagram illustrating an exemplary, non-limiting embodiment of a receiver inner clock generation circuit in accordance with various aspects described herein.

FIG. 2A is a block diagram illustrating an exemplary, non-limiting embodiment of a receiver inner clock generation circuit in accordance with various aspects described herein. As shown in FIG. 2A, receiver inner clock generation circuit 200 comprises several components including a central phase-locked loop (PLL 201), a CDR 202, a selectable frequency divider 203, a multiphase clock generator (MPCG 204), a deskew stage 205, a duty-cycle limiter 206, and a rank 2 phase rotator (PR 207). Also illustrated are rank 1 and rank 2 track-and-hold (TnH) sampling circuits 208, 209, respectively, with preceding corresponding buffers. To support wide bandwidth clock generation, each component of the inner clock generation circuit must be able to perform over an extremely wide bandwidth. The inner clock generation circuit supports the wide bandwidth requirements by incorporating components designed from CMOS tri-state inverters, as set forth in more detail below, without inductive peaking elements. Although the receiver side is described in this disclosure, many of the same components are present in the transmitter side as well.

In the receiver inner clock generation circuit 200, reference clocks are supplied to each lane from PLL 201. CDR 202 is used to align the clock sampling edges to the center of the data. CDR 202 is also used to track part-per-million (ppm) offsets between the data and clock rates either by adjusting frequency or phase of the clocks. Selectable frequency divider 203 is used in the clocking architecture to support legacy standards, rather than alternatively turning off a portion of the data path (i.e., reducing first rank interleaving from 16 to 8). MPCG 204 and deskew stage 205 create the reference phases for the sampling circuits 208, 209. Duty-cycle limiter 206 generates 25% duty cycle clocks before rank 1 sampling circuit 208 to improve performance of the data path. Finally, PR 207 ensures rank 2 sampling circuit 209 occurs at the correct point. While this exact implementation is unique to this disclosure, the significant features lie within the implementation, as set forth below.

CDR 202 must have high resolution and excellent linearity to negligibly contribute to the clocking jitter. As such, CDR 202 should be placed at the point in the clocking path where the narrowest bandwidth must be supported, and the minimum number of phases must be generated given the high-power cost per phase. Therefore, it is intuitive for CDR 202 to be placed first in the receiver inner clock generation before the selectable frequency divider 203 or MPCG 204. Modern CDRs are typically implemented with either Voltage Controlled Oscillators (VCOs) or Current Mode Logic (CML) Phase Rotators (PRs). These are common choices because of their low jitter derived from their tuned structures. Complementary metal oxide semiconductor (CMOS) structures have been used at past data rates, but their large area and power make them unpopular at 100-GS/s and beyond.

Figure 2B:
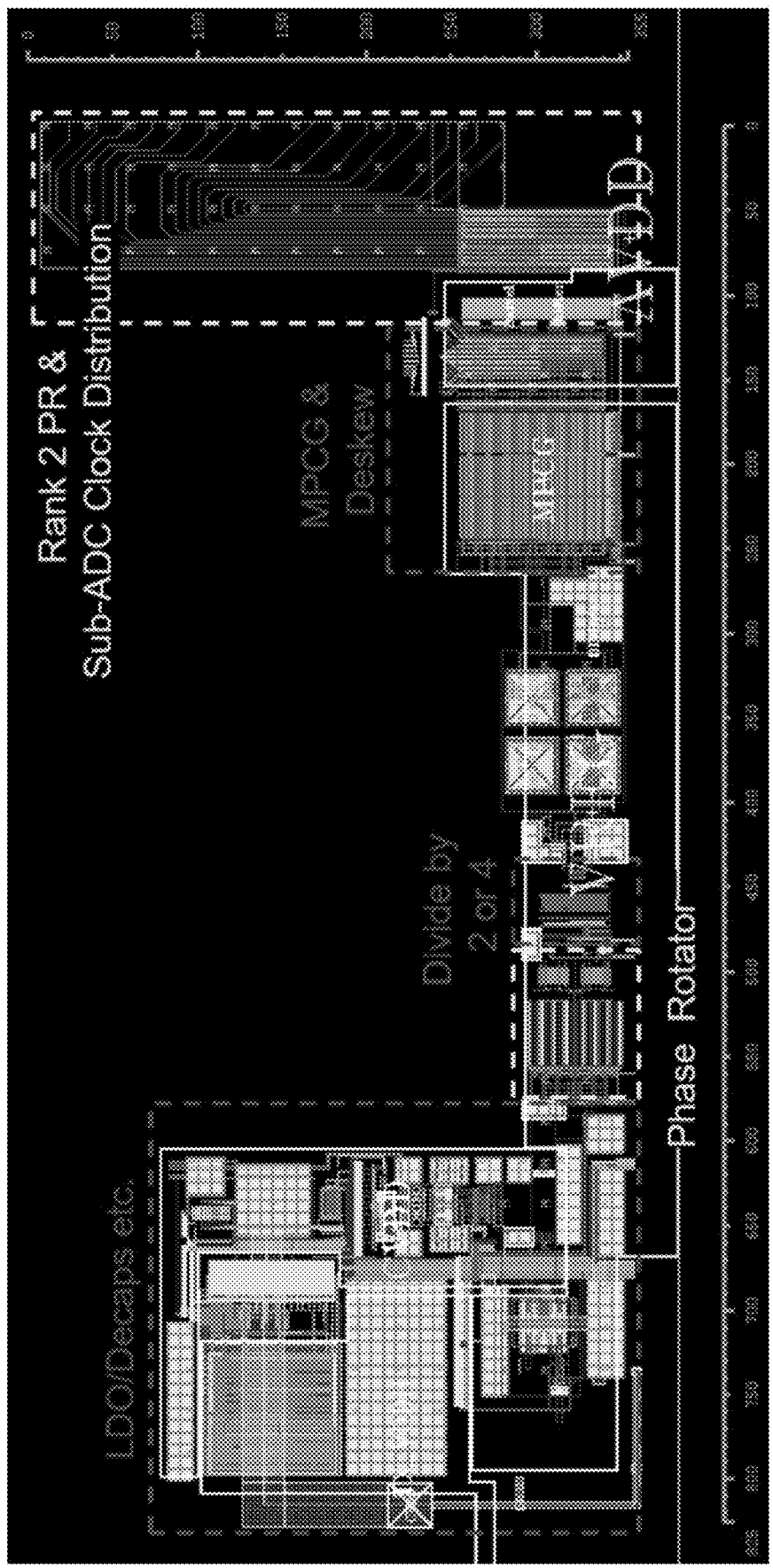
FIG. 2B is a layout diagram illustrating an exemplary, non-limiting embodiment of a receiver inner clock generation circuit in accordance with various aspects described herein.

FIG. 2B is a layout diagram illustrating an exemplary, non-limiting embodiment of a receiver inner clock generation circuit in accordance with various aspects described herein. In an embodiment, inner clock generation circuit 200 described herein is illustrated in layout 210 that uses an area of 325 µm×100 µm. The best way to evaluate the complete clock path performance is by simulating it with the data path.

Figure 2C:
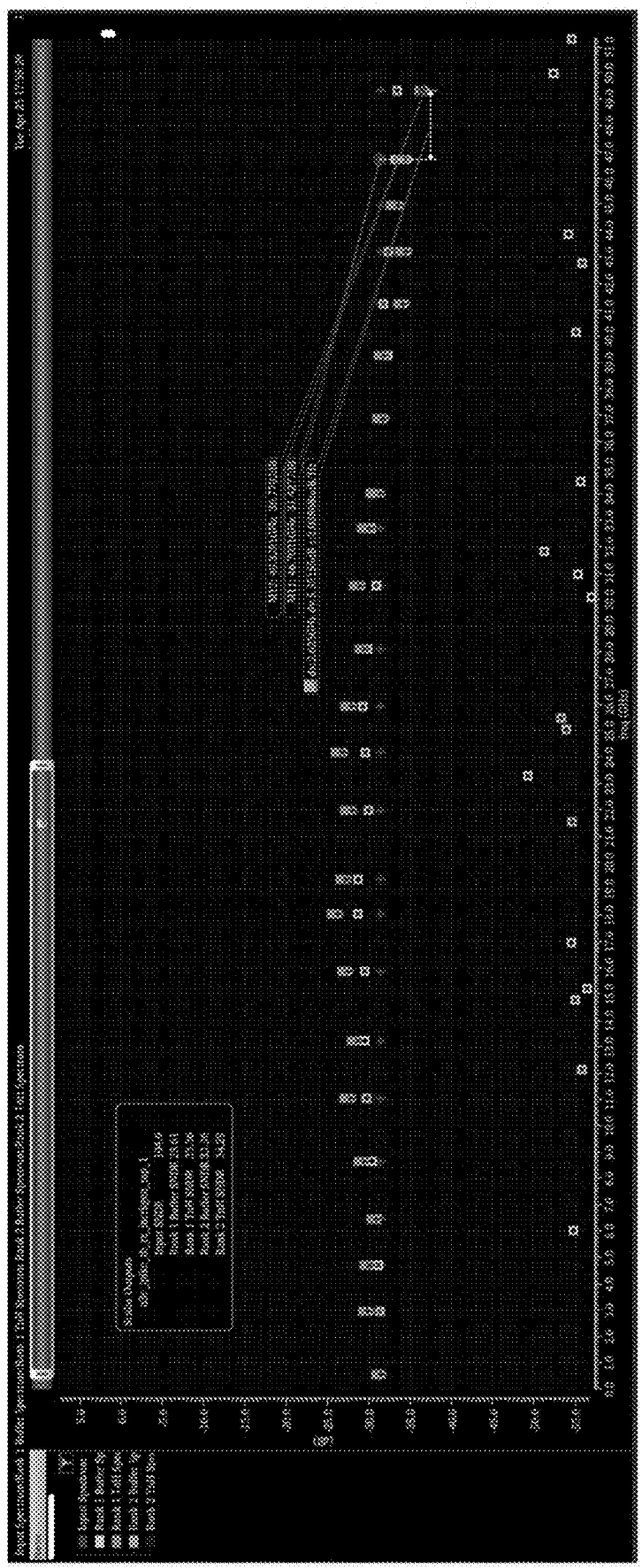
FIG. 2C comprises a chart showing a data path transfer function and simulated SNDR at select points.

FIG. 2C comprises a chart showing a data path transfer function and simulated SNDR at select points. As shown in FIG. 2C, chart 220 shows the data path transfer function when using the clock path to drive the rank 1 and rank 2 track and hold sampling circuits. The output SNDR is measured to be 34.3 dB at the output which is down from 35.3 dB with an ideal clock path. This 1 dB degradation demonstrates the strong performance of the clock path in such a small area.

Figure 2D:
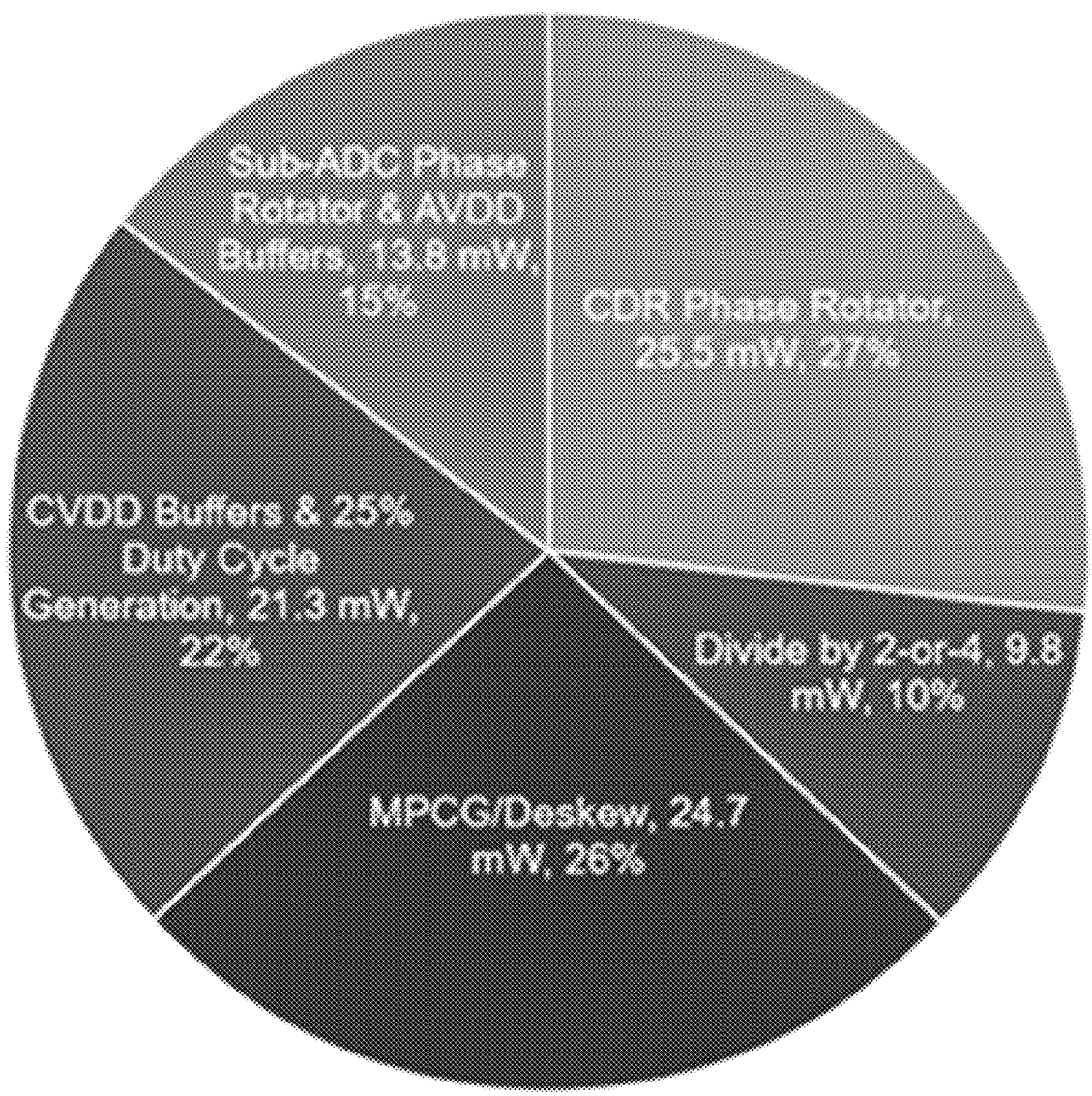
FIG. 2D comprises a chart summarizing total power consumption of an inner clock generation circuit in accordance with various aspects herein.

FIG. 2D comprises a chart summarizing total power consumption of an inner clock generation circuit in accordance with various aspects herein. As shown in FIG. 2D, chart 230 shows the total power consumption of the inner clock generation circuit operating at Fs=112-GS/s to be 95.1 mW, which is state-of-the-art for modern wireline transceivers.

Figure 3A:
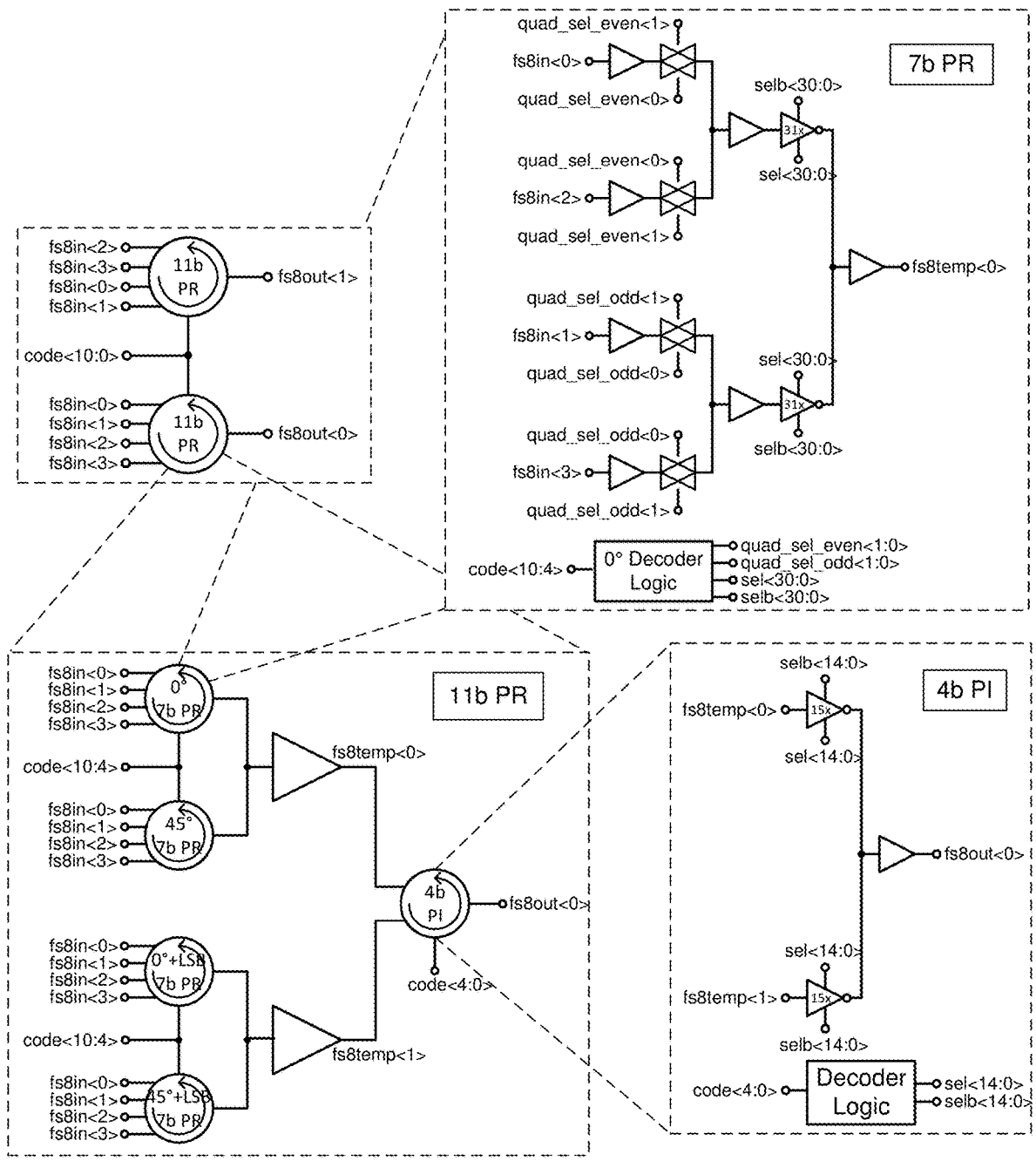
FIG. 3A is a schematic diagram illustrating an exemplary, non-limiting embodiment of a phase rotator used in a clock and data recovery loop in accordance with various aspects described herein.

FIG. 3A is a schematic diagram illustrating an exemplary, non-limiting embodiment of a phase rotator used in a clock and data recovery loop in accordance with various aspects described herein. As shown in FIG. 3A, a PR is used in the clock and data recovery loop (CDR 202) illustrated in FIG. 2. In an embodiment, CDR 202 takes advantage of a 11-bit CMOS PR based on tri-state inverters that achieves low jitter, power and area while achieving a large bandwidth. The 11-bit CMOS PR of CDR 202 comprises four 7-bit PRs and a 4-bit phase interpolator (PI), as shown in FIG. 3A. The purpose of CDR 202 is to be able to move the clock in an extremely fine step size so that the data is sampled at the center point of the data, also known as the "eye" of the data.

U.S. patent application Ser. No. 18/060,787 entitled, "Method and Apparatus for Clock and Data Alignment that Reduces Power Consumption," filed on Dec. 1, 2022, which is incorporated by reference herein, provides more details about CDR 202.

Figure 3B:
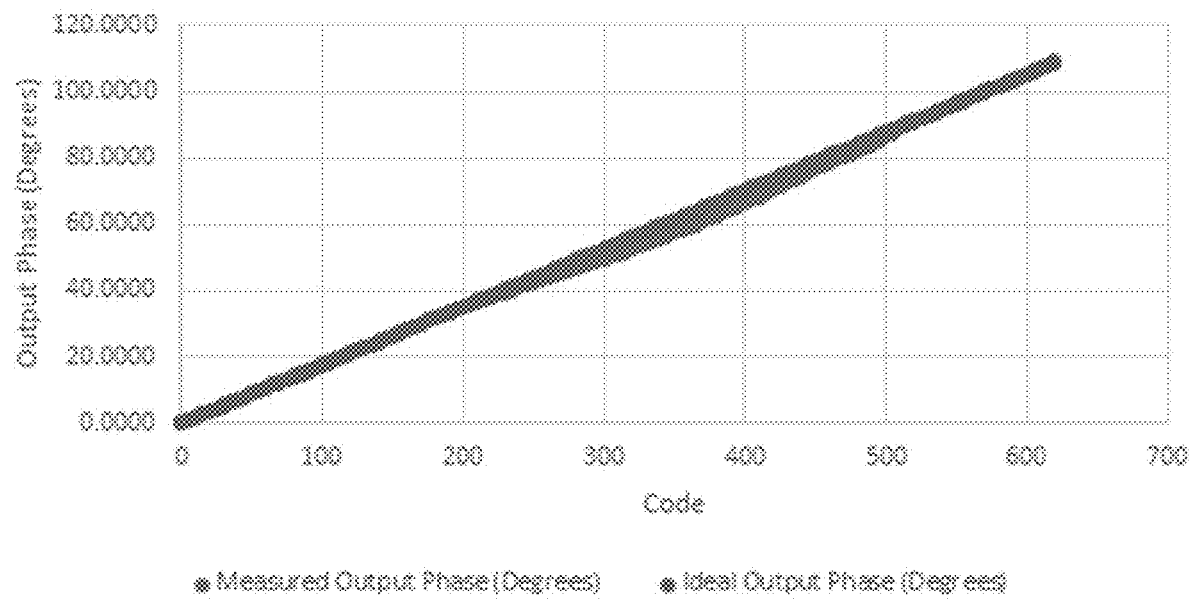
FIG. 3B is a chart illustrating a linearity performance of a phase rotator in accordance with various aspects described herein.

FIG. 3B is a chart illustrating a linearity performance of a phase rotator in accordance with various aspects described herein. As shown in FIG. 3B, chart 300 illustrates a measured output phase and an ideal output phase for a portion of the phase rotator codes.

Figure 3C:
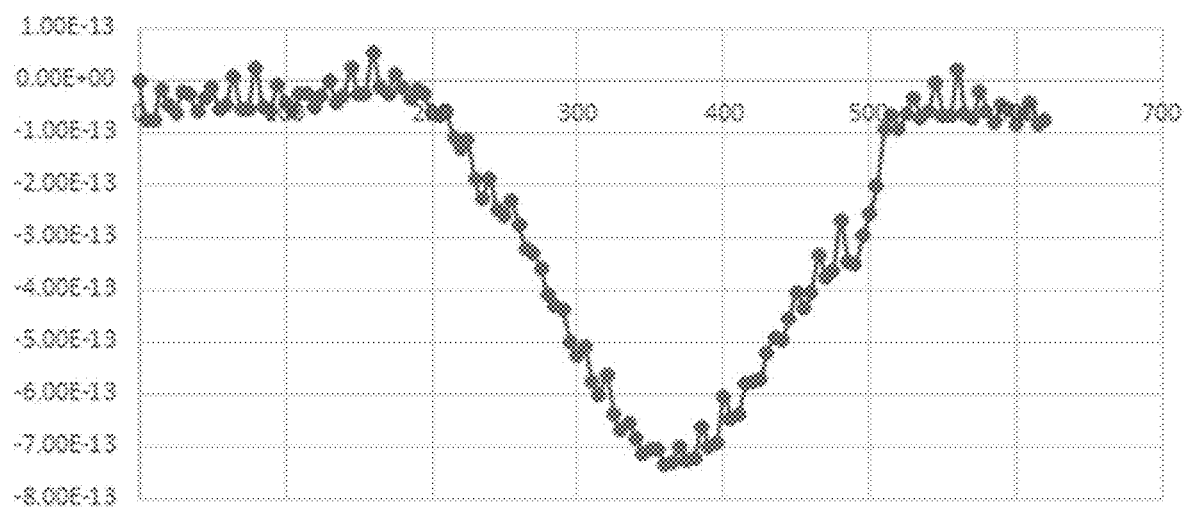
FIG. 3C is a chart illustrating an integral non-linearity performance of a phase rotator in accordance with various aspects described herein.

FIG. 3C is a chart illustrating an integral non-linearity performance of a phase rotator in accordance with various aspects described herein. Chart 310 shows that the integral non-linearity (INL) reaches a peak-peak value of ~700 fs, which translates directly to the peak-peak jitter during plesiochronous operation. However, this raw INL value is low enough that it can be easily corrected with a lookup table (LUT) so that it has no effect on system performance. The static jitter of the PR is measured to be about 100 fs (rms) and consumes ~40 mA from a 0.65V supply. These metrics (area, linearity, jitter and power) meet requirements to be used in modern and legacy wireline transceivers.

Referring back to FIG. 2A, a selectable frequency divider 203 follows CDR 202 and is placed before MPCG 204 so that clock frequency division is performed on a limited number of phases. Hence, selectable frequency divider 203 can be used as to reduce the number of phases generated by a phase clock generator by a factor of two, such that CDR 202 only needs to generate two phases and the selectable divider can perform quadrature phase generation for input to MPCG 204.

Figure 4A:
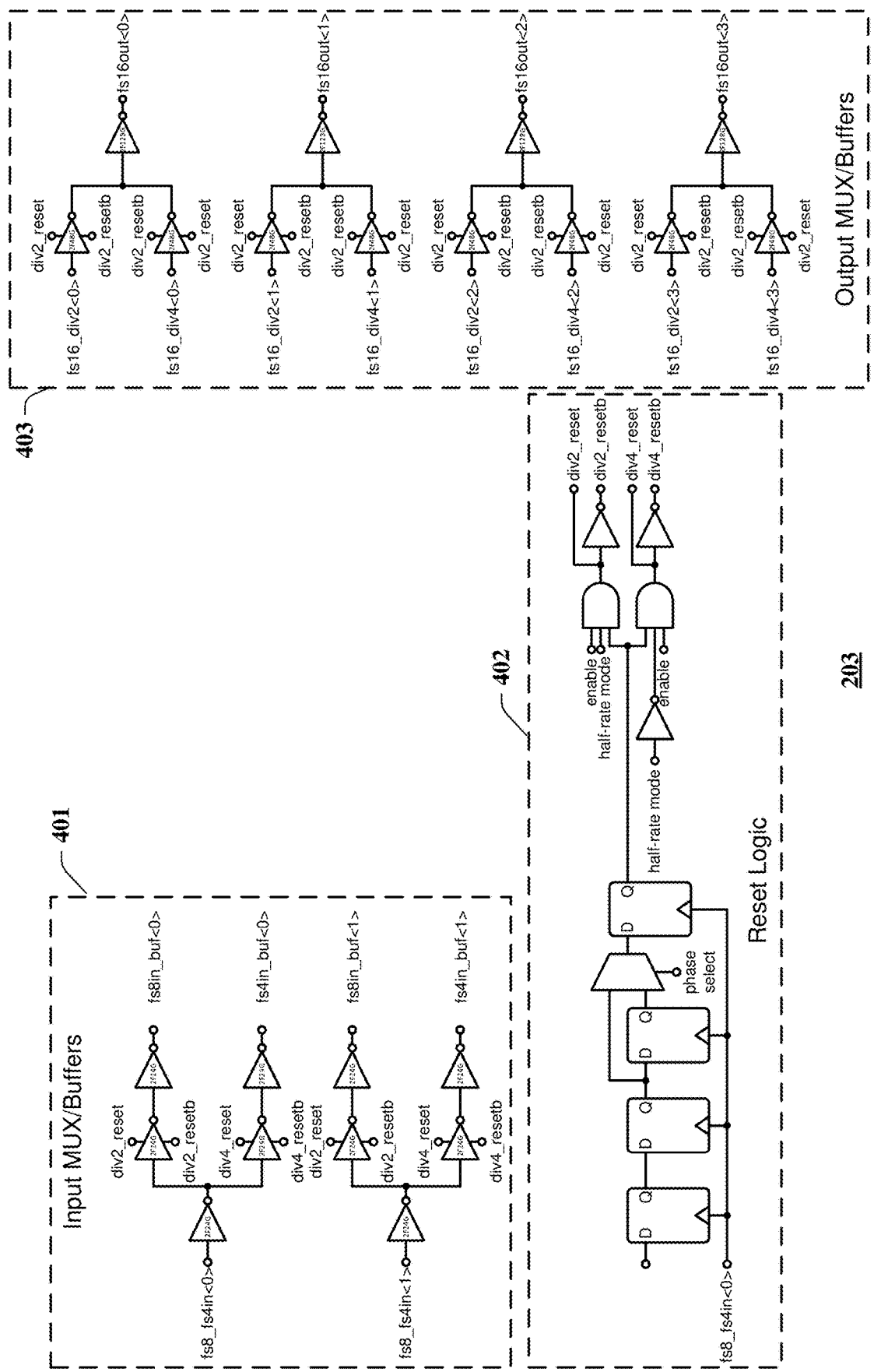
FIG. 4A is a schematic diagram illustrating an exemplary, non-limiting embodiment of circuit designs for a selectable divider in accordance with various aspects described herein.

FIG. 4A is a schematic diagram illustrating an exemplary, non-limiting embodiment of circuit designs for a selectable divider in accordance with various aspects described herein. As shown in FIG. 4A, input multiplexers and buffers 401, reset logic 402, and output multiplexers and buffers 403 support a selectable frequency divider 203. There are many ways that a selectable divider may be implemented. For example, CML based dividers with inductive peaking are commonly used in wireline transceivers. Latch-based dividers are the most common implementation, but they have several shortcomings. There is an inherent asymmetry due to the feedback loop and the divider starts up in an unknown (non-deterministic) state, so synchronizing many dividers to do multi-phase clock division is difficult. Ring-based injection locked frequency dividers (ring-ILFDs) are another solution for dividers. Ring-IFLDs are a better choice for multi-phase clock division since a single divider schematic is used and there is no need for synchronization within a channel. However, ring-ILFDs also do not inherently have a reset, hence they start up in an unknown state. Additionally, if synchronization of multiple dividers is required, there is no inherent ability to synchronize a ring-IFLD. While these shortcomings may be non-issues for electrical applications, they are critical features in optical applications where up to four channels (XYIQ) must be synchronized.

Figure 4B:
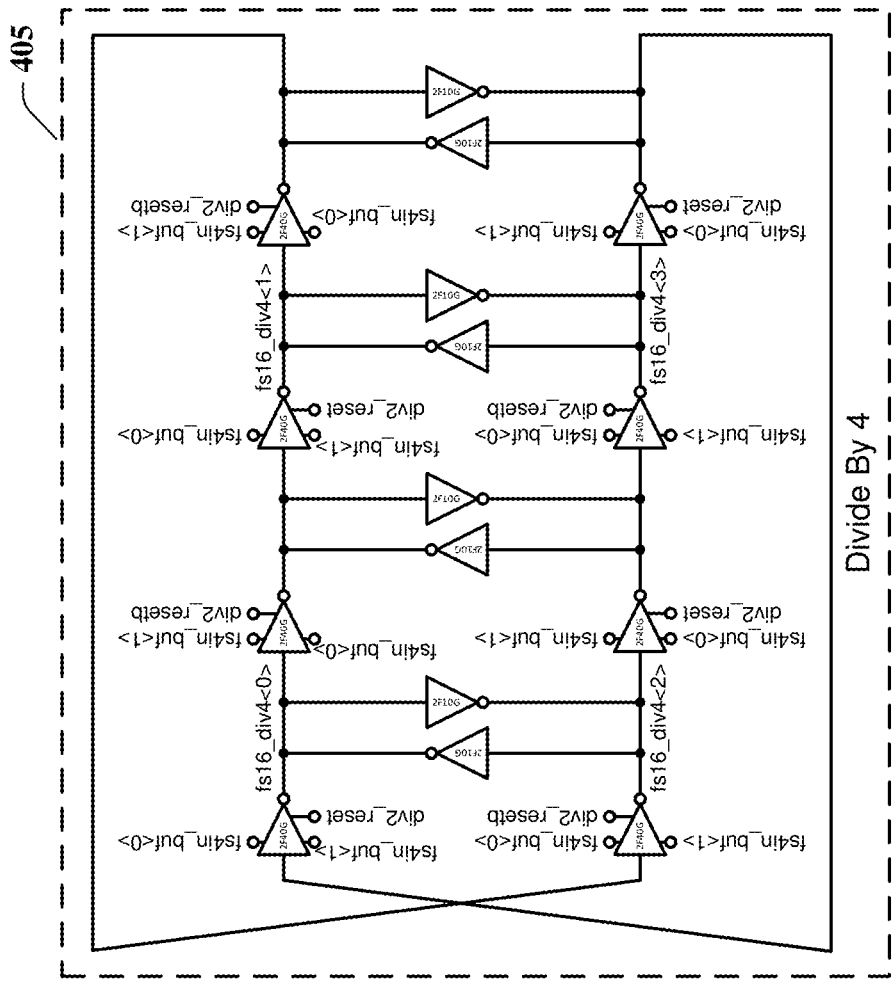
FIG. 4B is a schematic diagram illustrating resettable ring-based dividers that use CMOS elements to achieve a very wide bandwidth of operation in accordance with various aspects described herein.
Figure 4B:
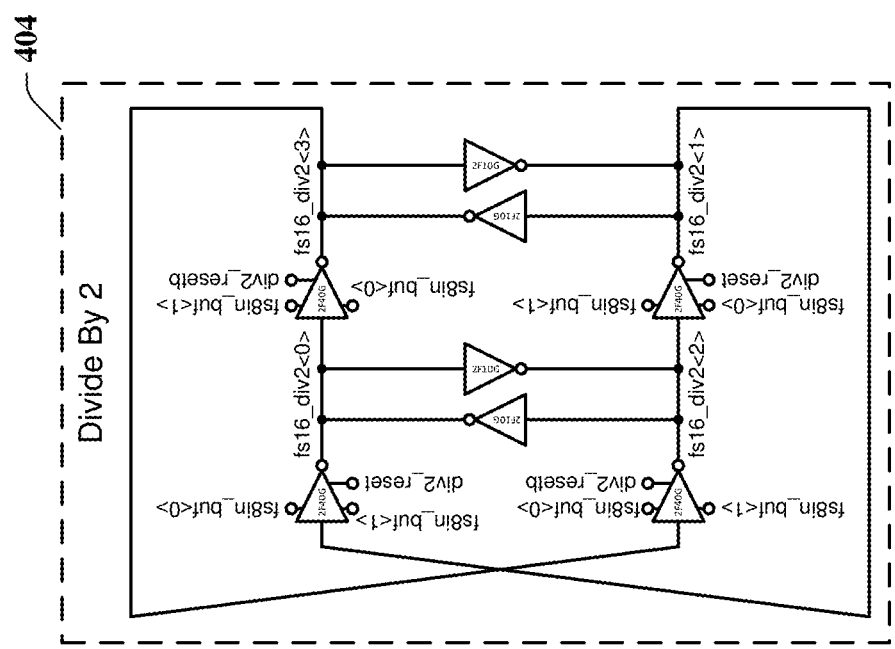

FIG. 4B is a schematic diagram illustrating resettable ring-based dividers that use CMOS elements to achieve a very wide bandwidth of operation in accordance with various aspects described herein. Divide-by-2 and divide-by-4 ring-based dividers 404, 405 are illustrated in FIG. 4B. While being held in a reset state, dividers 404, 405 do not consume any additional power. Hence, supporting divide-by-2, -4, -8, etc. is achieved with no additional cost of power, thereby making an attractive design for multi-rate support.

Figure 4C:
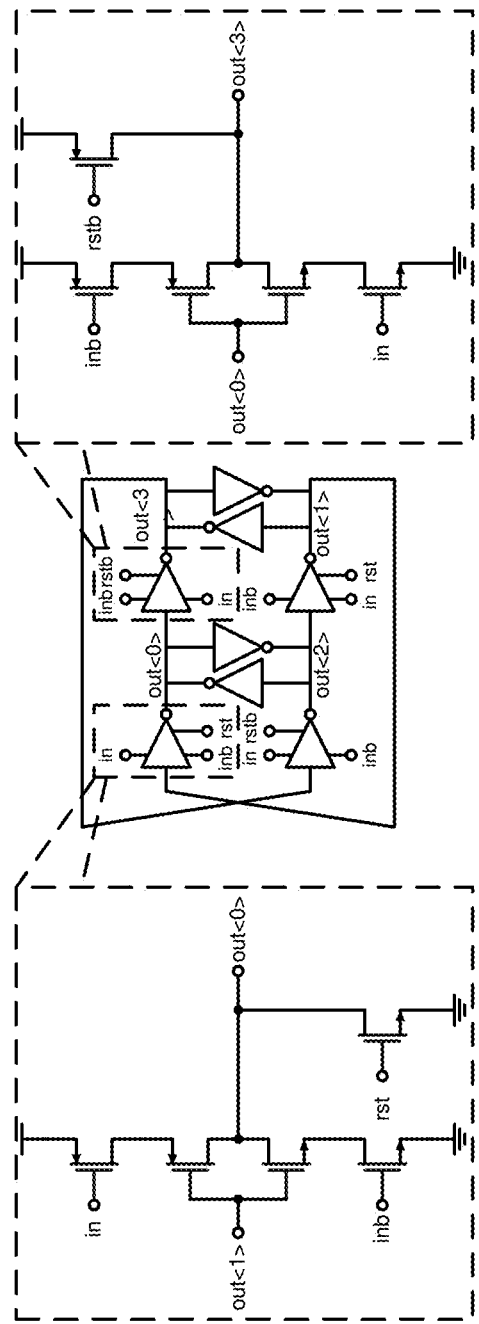
FIG. 4C is a schematic diagram illustrating resettable ring-based dividers in accordance with various aspects described herein.

FIG. 4C is a schematic diagram illustrating resettable ring-based dividers in accordance with various aspects described herein. As shown in FIG. 4C, a CMOS-based ring-ILFD divider is implemented using tri-state inverters where the input clocks are passed into the gate of the "select" devices, which is incorporated into dividers 404, 405 of FIG. 4B. This design adds a pull-up gate or a pull-down gate to the tri-state inverters to reset the ILFD by pulling the output node either to VDD or ground. The pull-up or pull-down devices reset the divider into a deterministic state by alternating pull-up and pull-down devices between opposite phases.

Figure 4D:
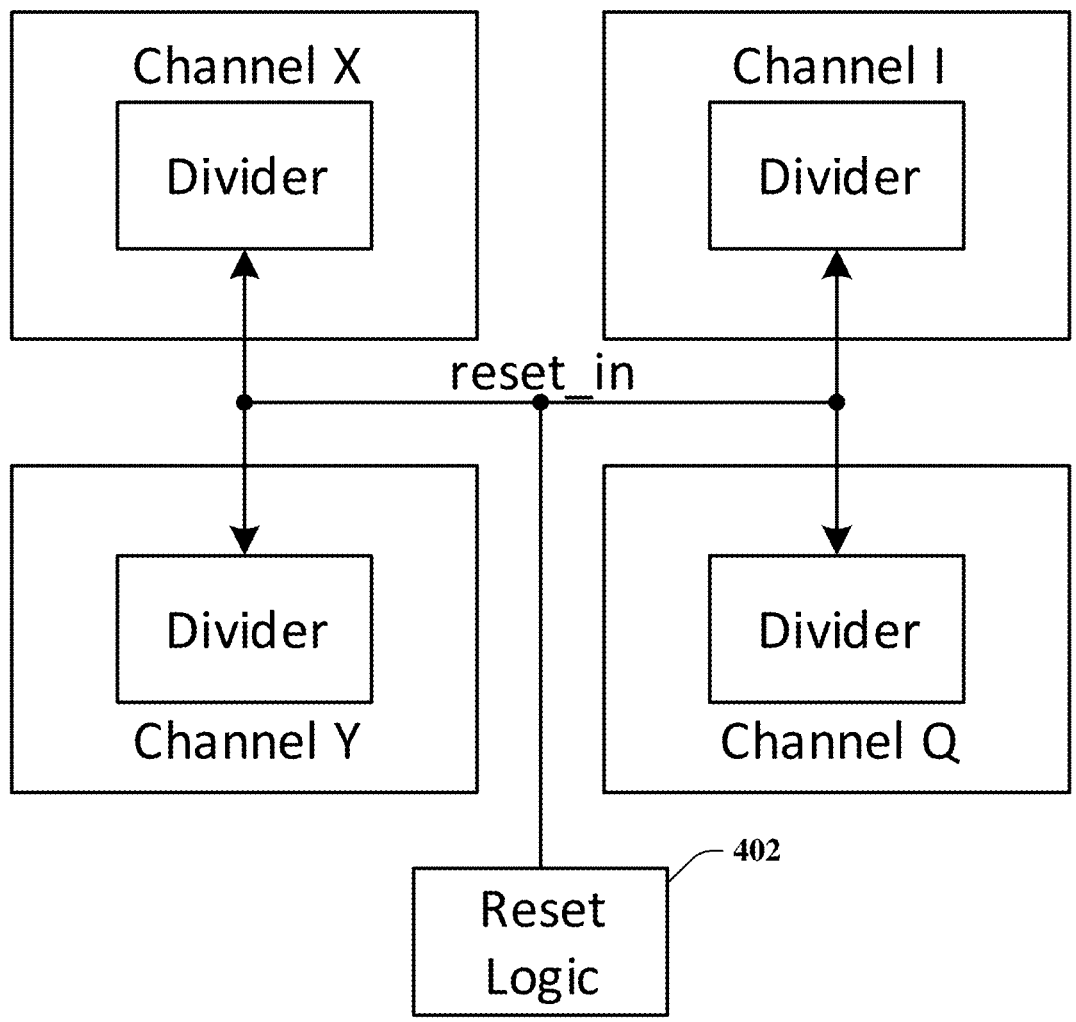
FIG. 4D is a schematic diagram illustrating distribution of a reset signal to multiple channels of dividers in accordance with various aspects described herein.

FIG. 4D is a schematic diagram illustrating distribution of a reset signal to multiple channels of dividers in accordance with various aspects described herein. As shown in FIG. 4D, the reset signal can be used to synchronize dividers either within a channel or across channels. To do so, the reset signal must originate from a central destination and then be distributed to each divider in a tree-like manner, so that the reset signal reaches each divider at the same time. Referring to FIG. 4A, reset logic 402 includes a flip-flop to enable flipping the output phase of the divider. The multiplexers of input multiplexers and buffers 401 and output multiplexers and buffers 403 select between two paths. One path passes the reset signal straight through to the divider. The second path delays the reset signal by one input clock cycle using a flip-flop. One input clock cycle corresponds to half a clock cycle at the output in a divide by 2, so this added delay has the effect of resetting the divider in a flipped state (i.e., 0° and 180° are swapped). This feature can be used in place of pull-up/pull-down devices described above or as an additional safety mechanism to correct sampling if the divider starts up with a clock 180 degrees out of phase.

Figure 4E:
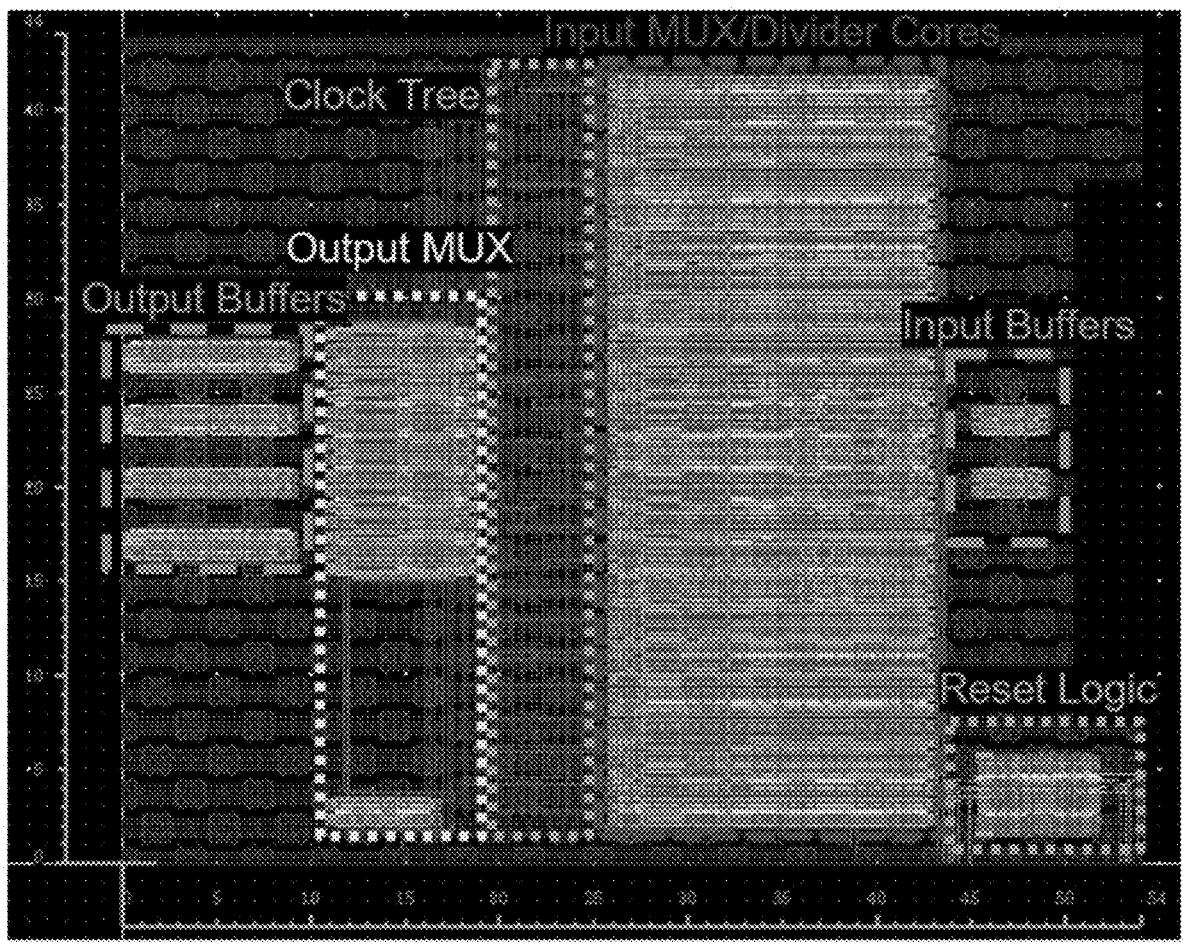
FIG. 4E is a layout diagram illustrating a resettable ring-based divider implemented in accordance with various aspects herein.

FIG. 4E is a layout diagram illustrating a resettable ring-based divider implemented in accordance with various aspects herein. FIG. 4E shows a complete layout 410 for a selectable divide-by-2 or-4 design combining all the features of selectable frequency divider 203 implemented on the Neutrino-T receiver inner clock generation. The selectable divider uses an area of 54 μm×44 μm.

Figure 4F:
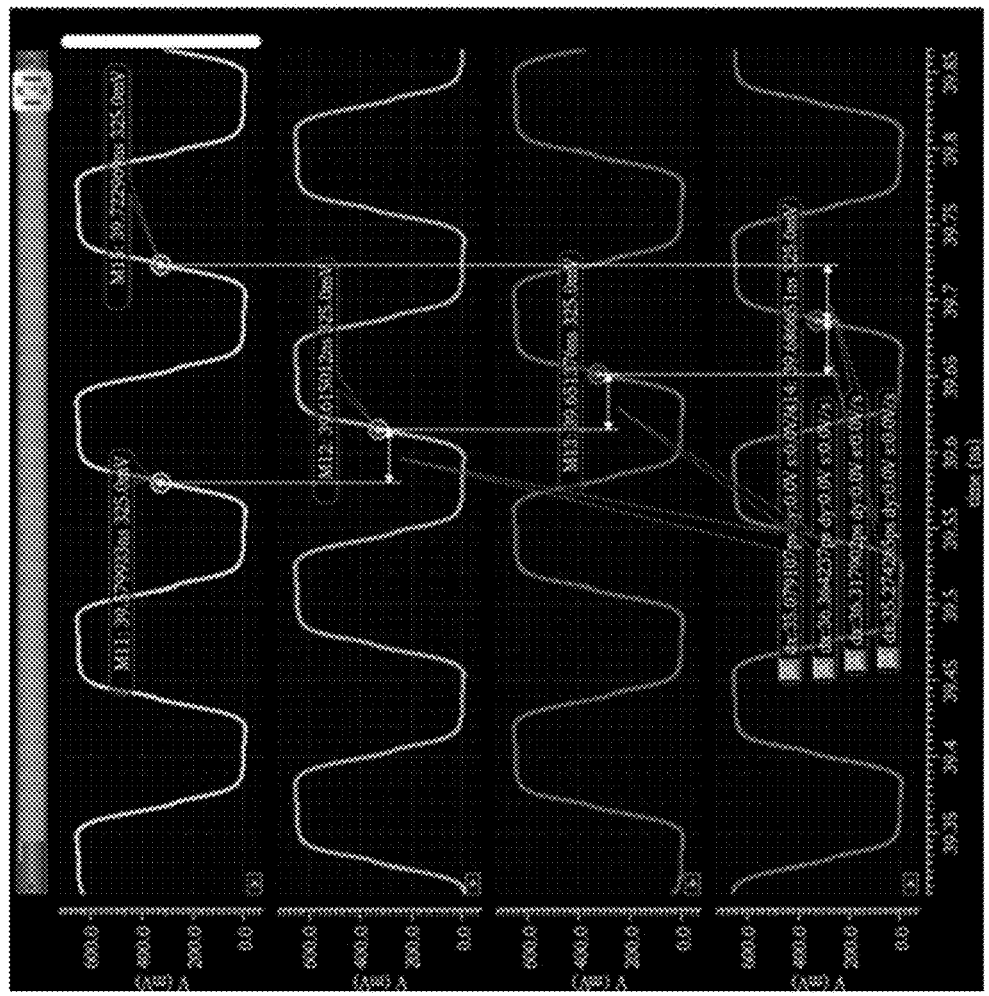
FIG. 4F comprises charts showing functionality of a selectable divider implemented in accordance with various aspects herein.
Figure 4F:
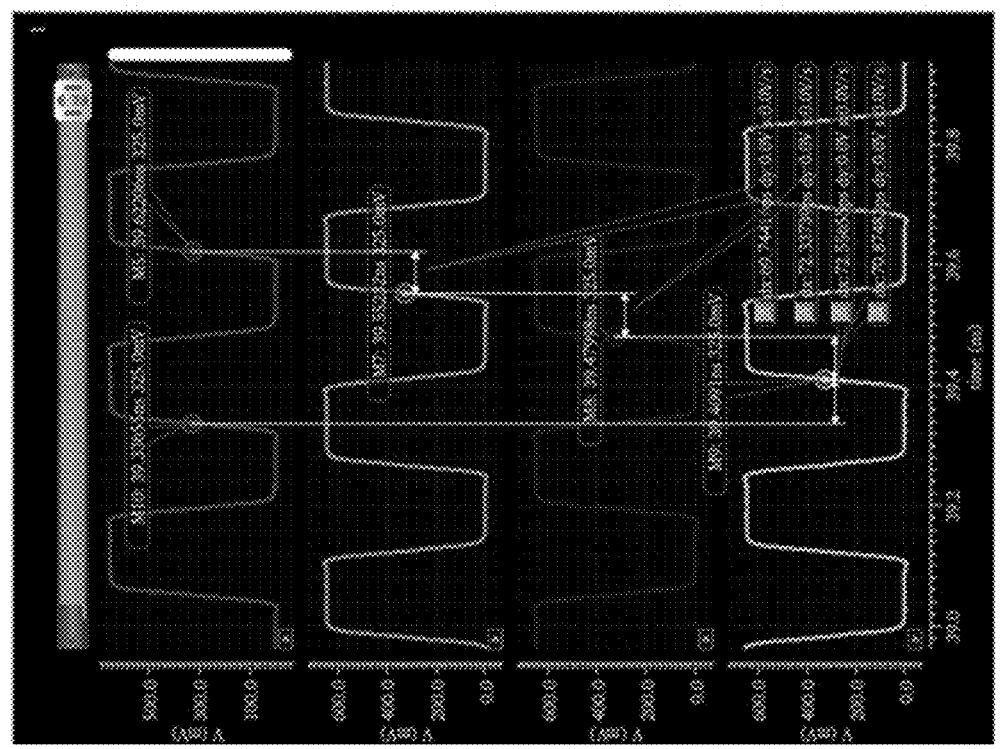

FIG. 4F comprises charts showing functionality of a selectable divider implemented in accordance with various aspects herein. As shown in FIG. 4F, chart 411 indicates the jitter is 70 fs (rms) at full-rate and draws 15 mA of current from a 0.65V supply. Chart 412 illustrates the functionality at half-rate, which indicates the jitter is 80 fs (rms) and draws 11 mA of current from a 0.65V supply.

Figure 5:
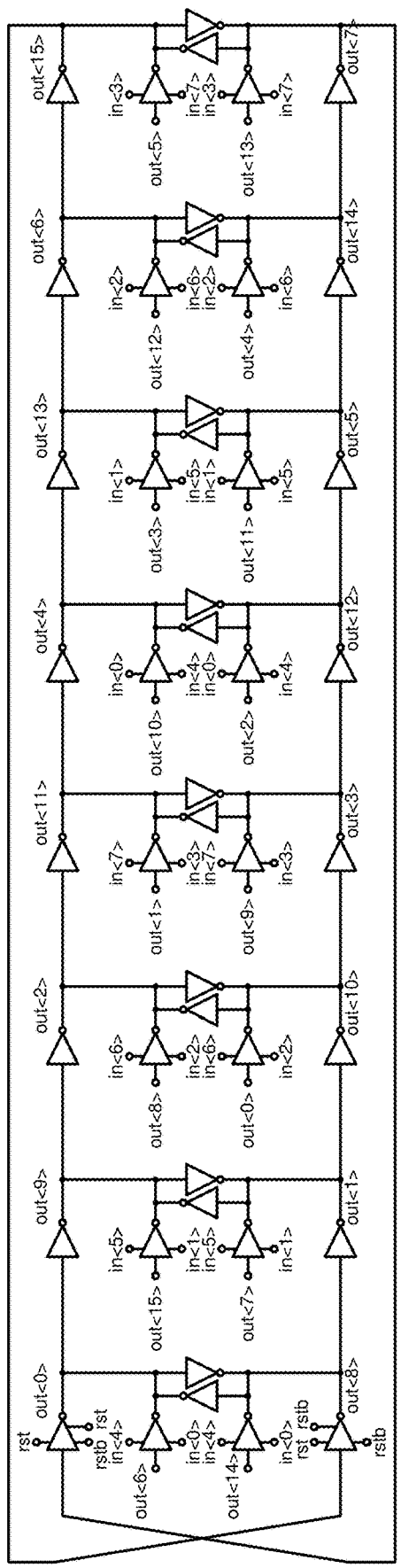
FIG. 5 is a schematic diagram illustrating an exemplary, non-limiting embodiment of a multipath ring oscillator injection locked frequency divider in accordance with various aspects described herein.

FIG. 5 is a schematic diagram illustrating an exemplary, non-limiting embodiment of a multipath ring oscillator injection locked frequency divider in accordance with various aspects described herein. As shown in FIG. 5, Multi-Path Ring Oscillator ILFD 500 (MPRO-ILFD) is a modification of an ILFD that can be used to reach high frequency operation independent of the number of input/output phases. This makes MPRO-ILFDs attractive for use on the transmitter side where different levels of serialization require many clock rates at the same time. As shown in FIG. 5, a divide-by-2 MPRO-ILFD 500, which is implemented on the transmitter side, uses pull-up/pull-down devices to reset the divider in a deterministic state. MPRO-IFLD 500 has logic to flip the output state and is synchronized across multiple channels. Each element has a very wide bandwidth, which allows for multi-rate support. Multi-rate support is very difficult to achieve while also meeting power, area and jitter standards, but is achieved by this design. Having a very wide bandwidth architecture is extremely beneficial because it allows complete reuse for modern and legacy data rates on both the electrical and optical side. Previously entirely different architectures would be required to support each rate. By enabling complete reuse, significant design hours can be saved, and more time can be placed on verification.

Referring back to FIG. 2A, MPCG 204 and deskew stage 205 follow selectable frequency divider 203 because duty-cycle limiter 206 is only needed at the rank 1 track-and-hold sampling circuit 208 because the rank 2 clock phases are controllable independent of the rank 1 clocks. There are many common forms of MPCG 204 and deskew stage 205, including Injection Locked Ring Oscillators (ILROs), Delay Locked Loops (DLLs), analog Phase Interpolators (PIs), and polyphase filters. But each of these forms present a challenge in one or more of the following areas: space, jitter, skew, bandwidth, power, complexity, and reliability. Multiphase clock generation for MPCG 204 and deskew stage 205 are based on digital PIs, as set forth in U.S. patent application Ser. No. 18/509,565 entitled, "Multiphase Clock Generator," filed on even date herewith. This method of multiphase clock generation can achieve good usage regarding area, power, jitter and skew while performing well across a wide bandwidth, since the design is based on CMOS tri-state inverters.

Figure 6A:
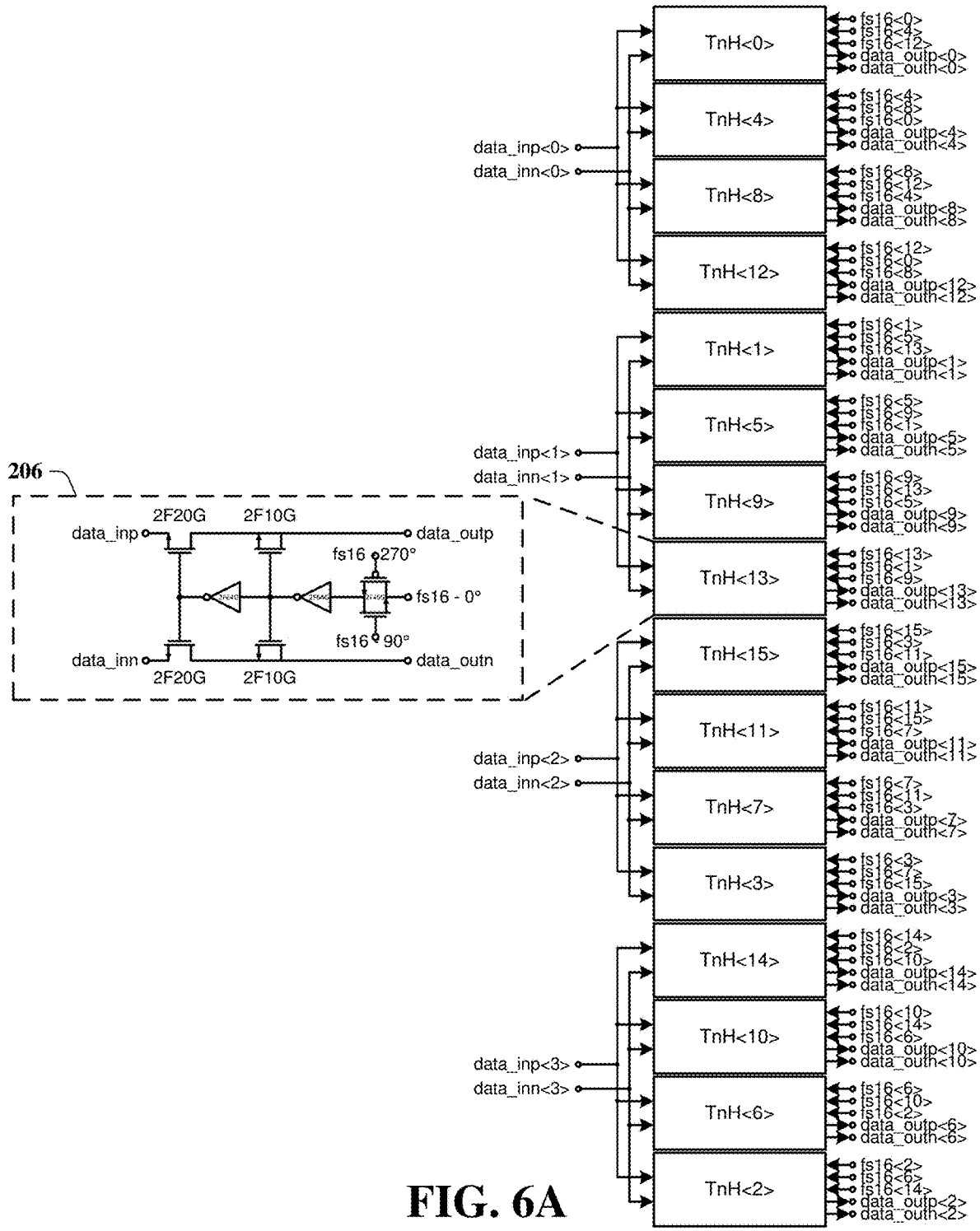
FIG. 6A is a schematic diagram illustrating an exemplary, non-limiting embodiment of a duty-cycle limiter incorporated in a track and hold sampling circuit in accordance with various aspects described herein.

FIG. 6A is a schematic diagram illustrating an exemplary, non-limiting embodiment of a duty-cycle limiter incorporated in a track and hold sampling circuit in accordance with various aspects described herein. The duty-cycle limiter can generate any duty cycle less than 100% based on available clock phases supplied at input and needs of the track and hold circuit. For example, as illustrated in FIG. 6A, the track and hold sampling circuits are arranged in groups of four so that clock feedthrough noise and kickback through the input signal channel is minimized in each group. Each track and hold sampling circuit in the group uses three of the same four quadrature clock signals. Because each track and hold sampling circuit in the group is located near each other, errors introduced by clock signal line length delay can be minimized in the design of each group. Further, deskew for line length delays of the high frequency clock generator to each group of track and hold sampling circuits can be handled by the deskew stage 205. Other arrangements may be contemplated with these principles in mind.

In the exemplary embodiment, by using a 25% duty cycle clock, only one of the four track and hold sampling circuits is actively tracking in the group at a time during a complete cycle, while the other three are holding. There are many ways to perform 25% duty cycle generation, the most common of which is using an AND gate. In this implementation, duty-cycle limiter 206 generates a clock signal having a 25% duty cycle. The AND gate function is performed by a T-gate. The T-gate has a 90-degree clock connected to a N-doped terminal of a MOSFET, a 270-degree clock connected to a P-doped terminal of the MOSFET and a zero-degree clock connected to the gate of the MOSFET. The output of the T-gate is clock 90° and clock 270° and clock 0°. By using both the 90-degree clock and the 270-degree clock to manufacture the leading clock edge, the T-gate averages any jitter in either clock signal, thereby reducing jitter, as shown in FIG. 6E below.

Figure 6B:
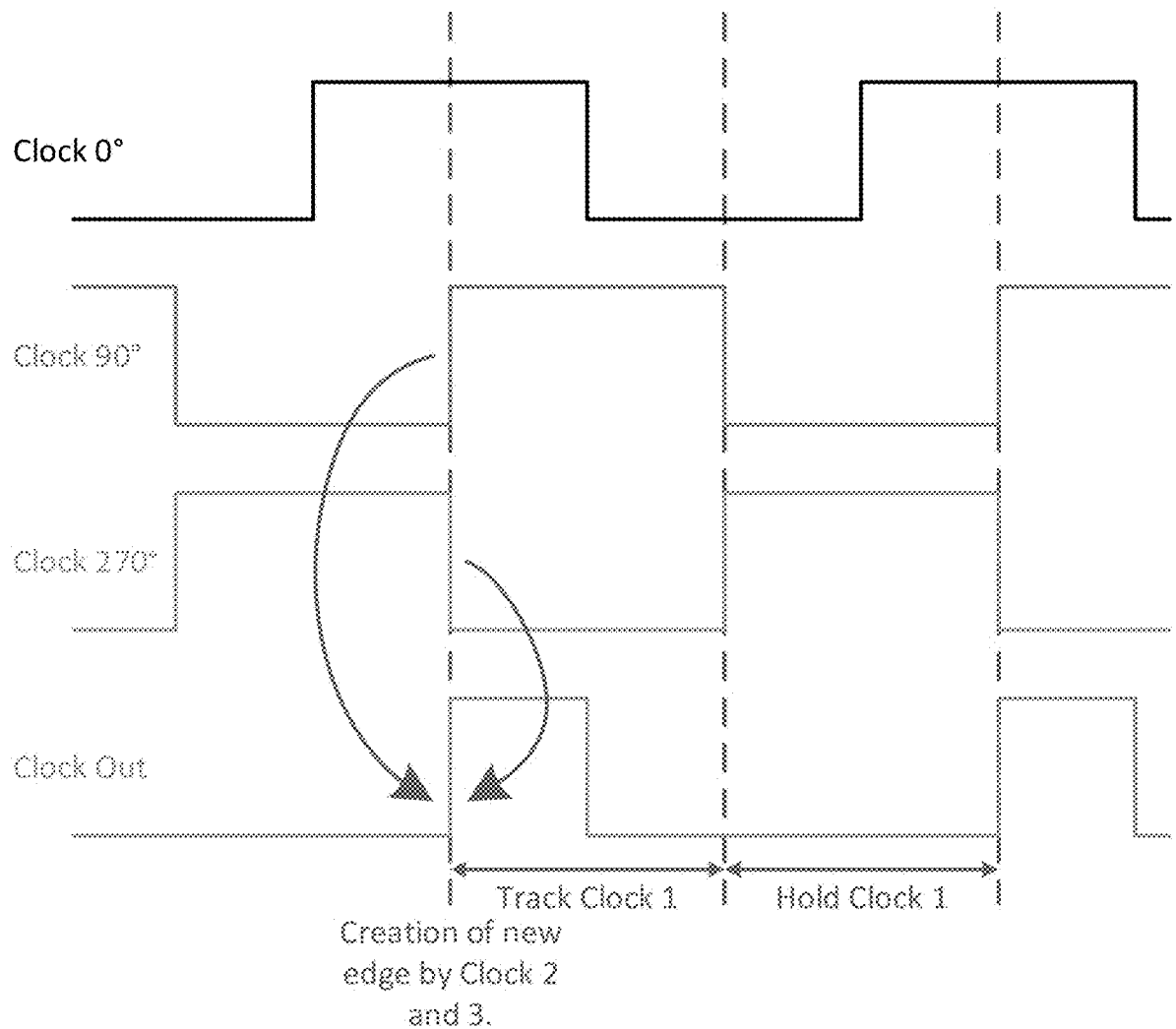
FIG. 6B is a timing diagram illustrating the operation of a 25% duty cycle limiter in accordance with various aspects described herein.

FIG. 6B is a timing diagram illustrating the operation of a 25% duty cycle limiter in accordance with various aspects described herein. As shown in FIG. 6B, when phase 90° in duty-cycle limiter 306 goes high (and 270° low) a new edge is created as the output reaches equilibrium with phase 0°. The output continues to track phase 0° until phase 90° goes low (and 270° high) at which point the output is held low.

Figure 6C:
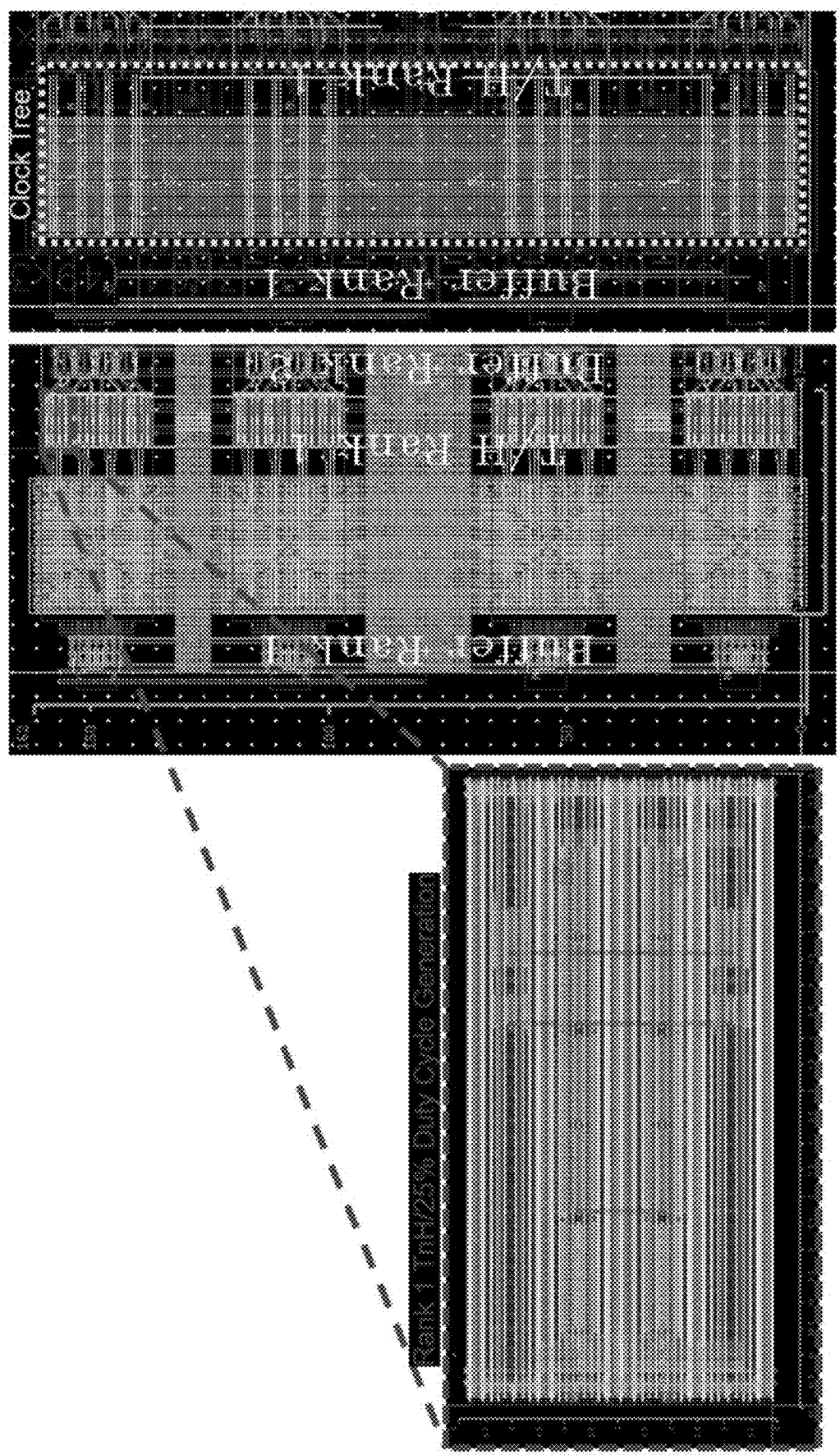
FIG. 6C is a layout diagram illustrating a 25% duty-cycle limiter implemented in accordance with various aspects herein.

FIG. 6C is a layout diagram illustrating a 25% duty-cycle limiter implemented in accordance with various aspects herein. As shown in FIG. 6C, layout 610 illustrates that the 25% duty cycle generation is co-located with the data path.

Figure 6D:
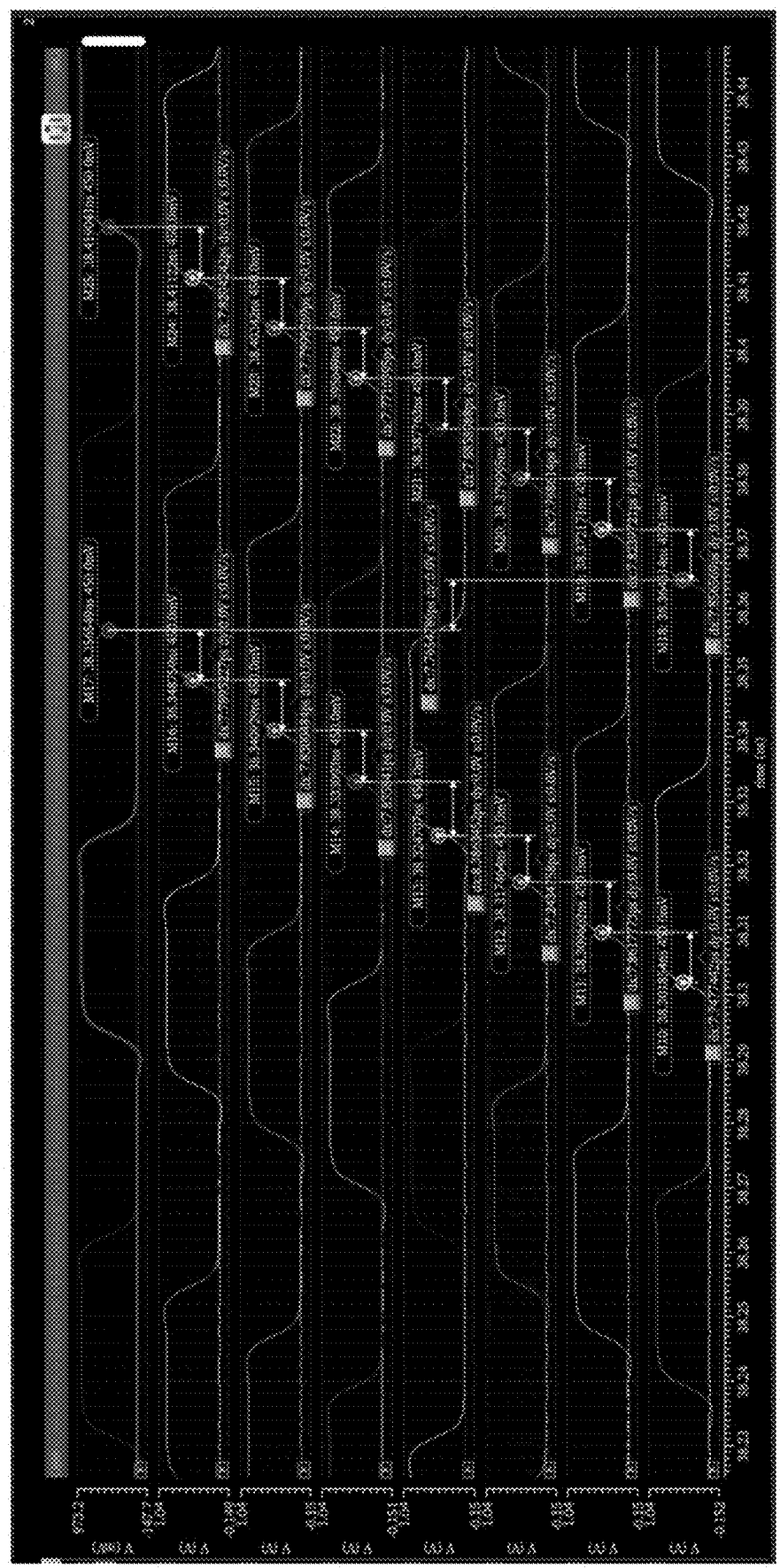
FIG. 6D is a graph showing simulated performance of a 25% duty cycle limiter implemented in accordance with various aspects herein.
Figure 6E:
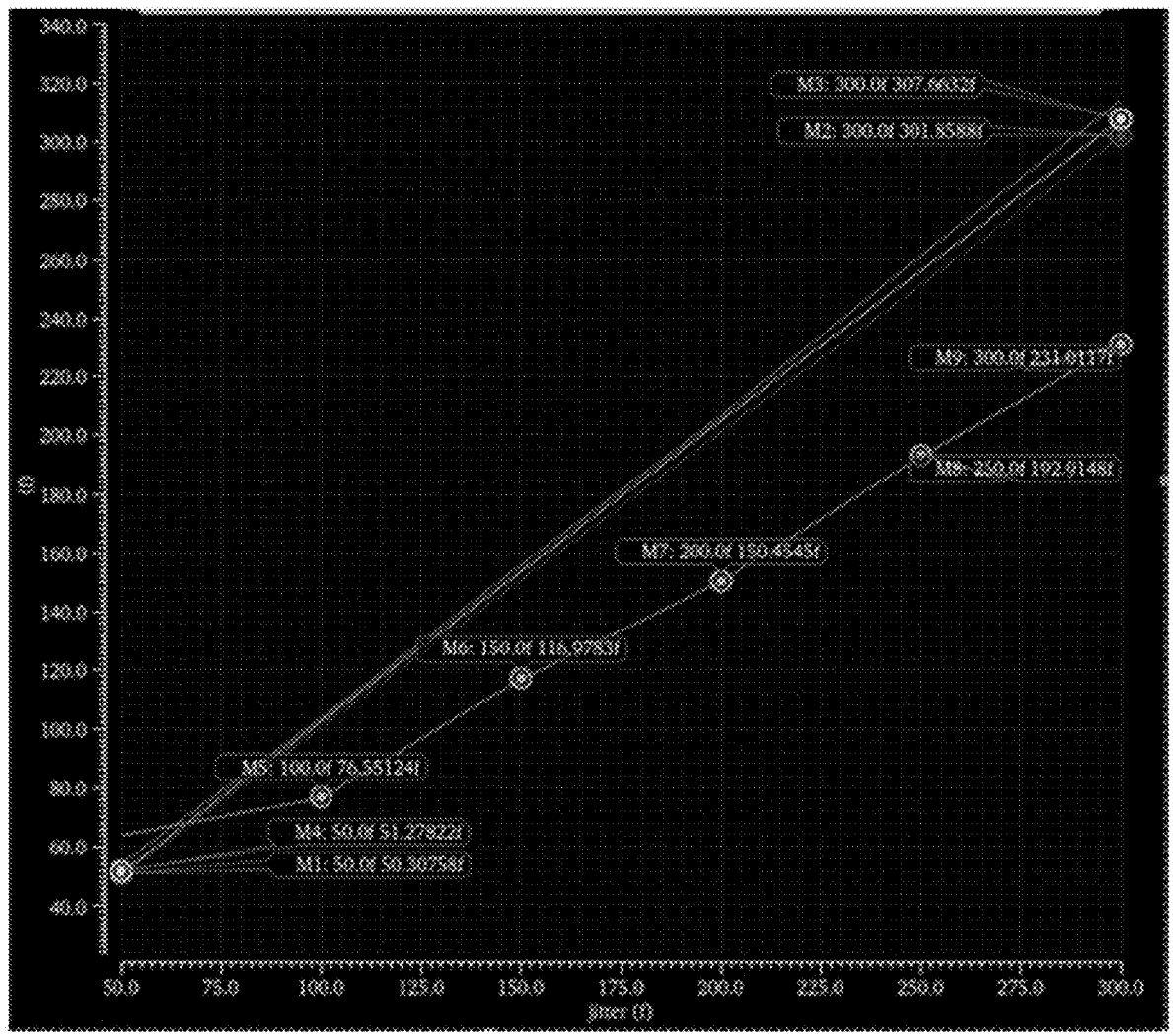
FIG. 6E is a graph showing jitter performance of a 25% duty-cycle limiter implemented in accordance with various aspects herein.

FIG. 6D is a graph showing simulated performance of a 25% duty cycle limiter implemented in accordance with various aspects herein. As shown in FIG. 6D, graph 620 illustrates the simulated performance of the 25% duty-cycle limiter operating at 7 GHz. The 25% duty cycle generation generates ~20 fs (rms) of jitter at full- and half-rate.

FIG. 6E is a graph showing jitter performance of a 25% duty-cycle limiter implemented in accordance with various aspects herein. As shown in FIG. 6E, graph 630 shows that the jitter measured at the output and input of the 25% duty-cycle limiter and a V2 jitter reduction.

Figure 7A:
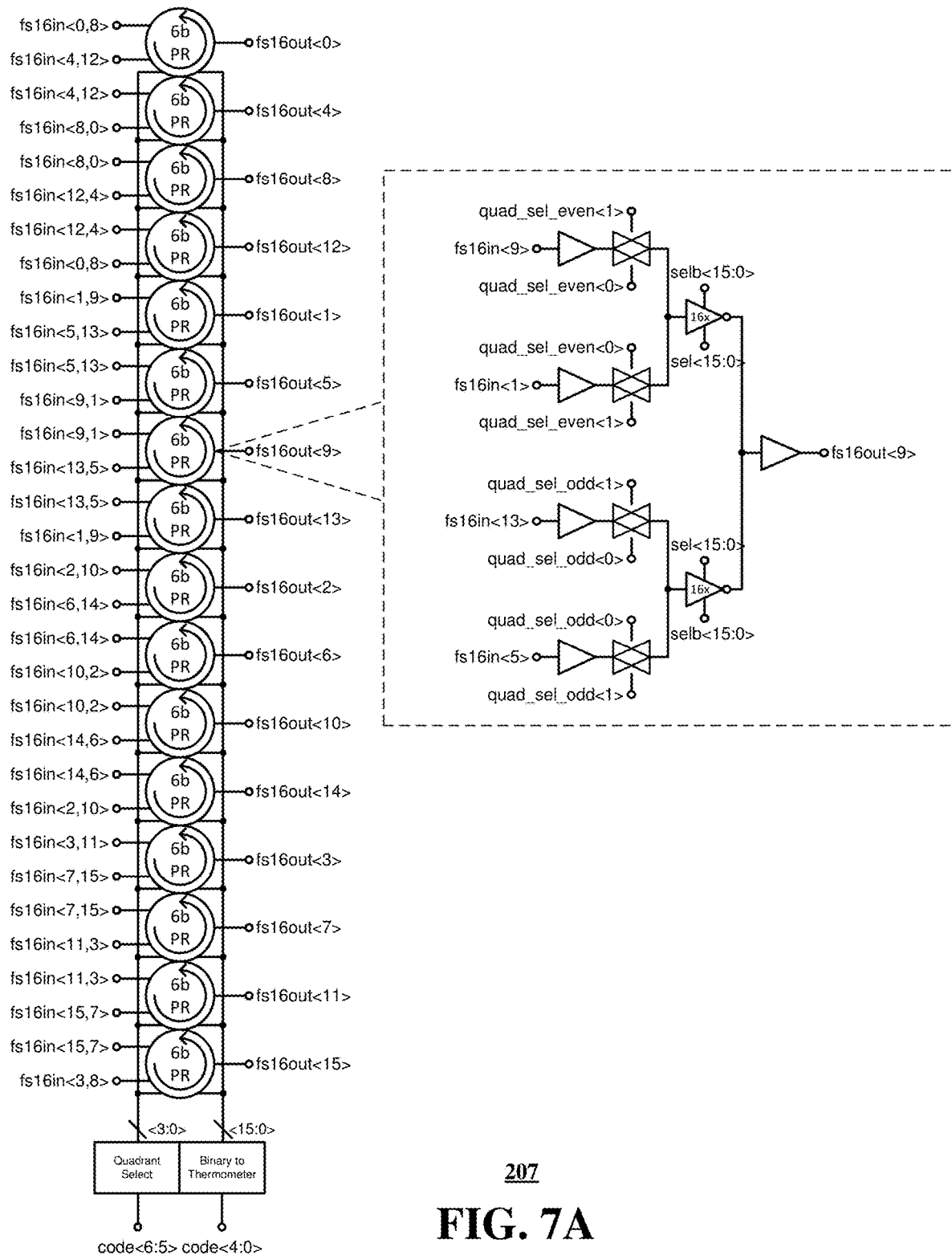
FIG. 7A is a schematic diagram illustrating an exemplary, non-limiting embodiment of a rank 2 phase rotator in accordance with various aspects described herein.

FIG. 7A is a schematic diagram illustrating an exemplary, non-limiting embodiment of a rank 2 phase rotator in accordance with various aspects described herein. Depending on the resolution required in the data path, PR 207 could be as simple as a barrel shifter that rotates the input clocks with no added resolution. In this implementation, 16 traditional CMOS PRs are in parallel to achieve wide bandwidth and low power.

Figure 7B:
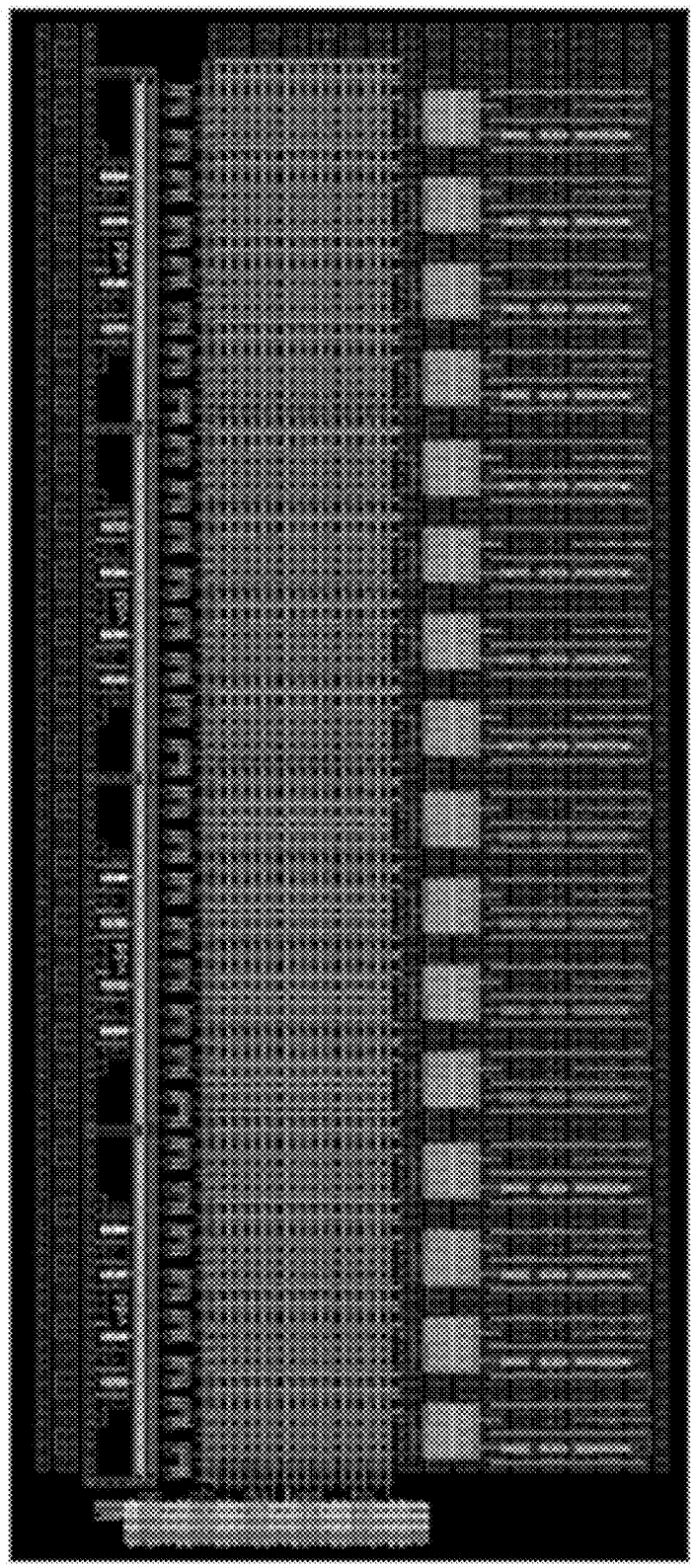
FIG. 7B is a layout diagram illustrating a rank 2 phase rotator implemented in accordance with various aspects herein.

FIG. 7B is a layout diagram illustrating a rank 2 phase rotator implemented in accordance with various aspects herein. FIG. 7B shows a complete layout 700 for PR 207, which occupies an area of 40 µm×100 µm.

Figure 7C:
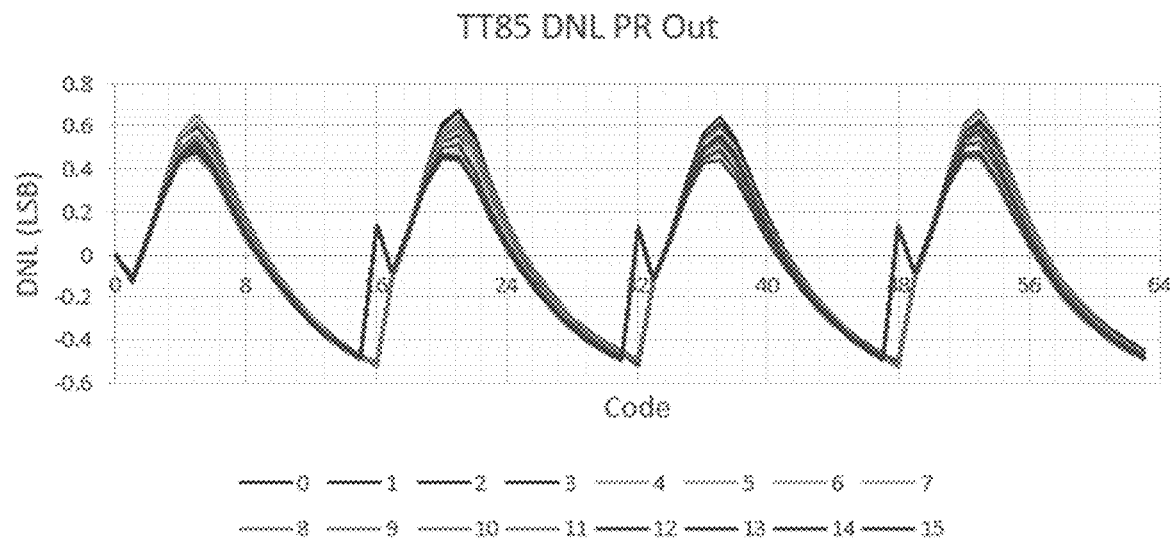
FIG. 7C comprises charts showing differential non-linearity and integral non-linearity a rank 2 phase rotator implemented in accordance with various aspects herein.
Figure 7C:
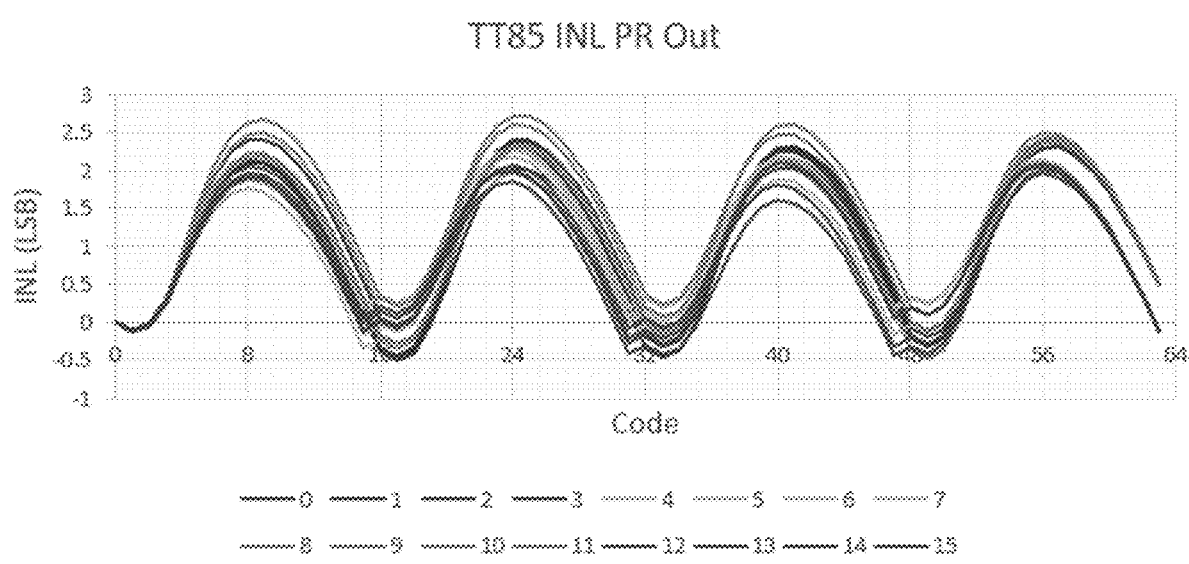

FIG. 7C comprises charts showing differential non-linearity and integral non-linearity a rank 2 phase rotator implemented in accordance with various aspects herein. As shown in FIG. 7C, chart 710 shows PR 207's differential non-linearity (DNL), which is simulated to be ±0.55 LSB. Chart 720 shows PR 207's integral non-linearity (INL), which is simulated to be ±1.5LSB.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Computing devices typically comprise a variety of media, which can comprise computer-readable storage media and/or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data. Computer-readable storage media can comprise the widest variety of storage media including tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per sc.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. An inner clock generation circuit, comprising:
   a selectable frequency divider, comprising:
      a ring of tri-state inverters;
      a reset gate on an output of each tri-state inverter in the ring; and
      a reset circuit comprising one or more selectable flip-flops; and
   a duty-cycle limiter that generates clock signals having a duty cycle less than 100% from three out of four quadrature clock signals.

2. The inner clock generation circuit of claim 1, wherein the tri-state inverters are formed using complementary metal oxide semiconductor.

3. The inner clock generation circuit of claim 1, wherein the ring comprises an injection locked frequency divider.

4. The inner clock generation circuit of claim 1, wherein the reset gate is either a pull-up gate or a pull-down gate.

5. The inner clock generation circuit of claim 1, wherein the reset circuit is configurable to synchronize the selectable frequency divider across channels.

6. The inner clock generation circuit of claim 1, wherein the reset gate, the reset circuit, or a combination thereof is configured to establish a deterministic starting state of the selectable frequency divider.

7. The inner clock generation circuit of claim 1, wherein the selectable frequency divider is selectable to divide clock signal frequency by 2, 4 or 8.

8. The inner clock generation circuit of claim 1, wherein the selectable frequency divider is configured to generate the quadrature clock signals.

9. The inner clock generation circuit of claim 1, wherein the duty-cycle limiter is co-located with rank 1 track and hold sampling circuits to reduce a line length for distribution of high frequency clock signals.

10. The inner clock generation circuit of claim 1, wherein the duty-cycle limiter reduces jitter by a factor of a square root of two.

11. The inner clock generation circuit of claim 1, wherein the duty-cycle limiter comprises a T-gate that generates a 25% duty cycle.

12. The inner clock generation circuit of claim 1, further comprising:
   a central phase-locked loop;
   a clock and data recovery loop coupled to the central phase-locked loop and the selectable frequency divider;
   a multiphase clock generator coupled to the selectable frequency divider;
   a deskew stage coupled to the multiphase clock generator, wherein the duty-cycle limiter is coupled to the deskew stage; and
   a rank 2 phase rotator coupled to the deskew stage.

13. The inner clock generation circuit of claim 12, wherein clock signals generated by the inner clock generation circuit enable a receiver to sample data at rates from 26.5 GS/s to 160 GS/s.

14. The inner clock generation circuit of claim 12, wherein a rank 2 track and hold circuit is coupled to the rank 2 phase rotator.

15. The inner clock generation circuit of claim 12, wherein the clock and data recovery loop is configured to generate two phases of clock signals.

16. The inner clock generation circuit of claim 12, wherein the multiphase clock generator and the deskew stage are configured to generate sixteen phases of clock signals.

17. A method for creating a deterministic starting state of a ring-based injection locked frequency divider in an inner clock generation circuit, comprising:
   implementing a reset gate on an output of each tri-state inverter in a ring of tri-state inverters;
   implementing a reset circuit comprising one or more selectable flip-flops;
   applying a reset signal to each reset gate, wherein the reset gate forces the output of the tri-state inverter to a starting state; and applying a phase select signal to the reset circuit, wherein the reset circuit inverts the output of the tri-state inverter.

18. The method of claim 17, wherein the reset gate is implemented as either a pull-up gate or a pull-down gate.

19. The method of claim 17, wherein the reset circuit is configurable to synchronize the ring-based injection locked frequency divider across channels.

20. An inner clock generation circuit, comprising:
- a central phase-locked loop;
- a clock and data recovery component coupled to the central phase-locked loop configured to generate two phases of clock signals;
- a selectable frequency divider coupled to the clock and data recovery component configured to generate quadrature clock signals, comprising:
  - a ring of tri-state inverters;
  - a reset gate on an output of each tri-state inverter in the ring; and
  - a reset circuit comprising one or more selectable flip-flops;
- a multiphase clock generator coupled to the selectable frequency divider;
- a deskew stage coupled to the multiphase clock generator, wherein the multiphase clock generator and the deskew stage are configured to generate sixteen phases of clock signals;
- a duty-cycle limiter coupled to the deskew stage and a rank 1 track and hold sampling circuit, wherein the duty-cycle limiter generates clock signals having a 25% duty cycle from three out of four quadrature clock signals out of the sixteen phases of clock signals; and
- a rank 2 phase rotator coupled to the deskew stage and a rank 2 track and hold sampling circuit.

* * * * *